US008227786B2

(12) United States Patent
Mikawa et al.

(10) Patent No.: US 8,227,786 B2
(45) Date of Patent: Jul. 24, 2012

(54) NONVOLATILE MEMORY ELEMENT

(75) Inventors: Takumi Mikawa, Shiga (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 12/967,624

(22) Filed: Dec. 14, 2010

(65) Prior Publication Data

US 2011/0140828 A1 Jun. 16, 2011

Related U.S. Application Data

(62) Division of application No. 12/295,500, filed as application No. PCT/JP2007/056424 on Mar. 27, 2007, now Pat. No. 7,884,346.

(30) Foreign Application Priority Data

Mar. 30, 2006 (JP) ................................. 2006-093988

(51) Int. Cl.
*H01L 47/00* (2006.01)
*G11C 11/00* (2006.01)
(52) U.S. Cl. ...................... 257/2; 257/E45.002; 365/148
(58) Field of Classification Search .................. 257/2, 3, 257/4, E45.002; 365/148, 163, 164
See application file for complete search history.

(56) References Cited

U.S. PATENT DOCUMENTS

| | | | |
|---|---|---|---|
| 6,185,122 B1 | 2/2001 | Johnson et al. | |
| 6,579,760 B1 | 6/2003 | Lung | |
| 6,635,914 B2 | 10/2003 | Kozicki et al. | |
| 6,850,429 B2 | 2/2005 | Rinerson et al. | |
| 2003/0234449 A1 | 12/2003 | Aratani et al. | |
| 2004/0159828 A1 | 8/2004 | Rinerson et al. | |
| 2004/0192006 A1 | 9/2004 | Campbell et al. | |
| 2004/0202041 A1 | 10/2004 | Hidenori | |
| 2006/0003263 A1 | 1/2006 | Chang | |
| 2006/0006374 A1 | 1/2006 | Chang | |
| 2006/0043595 A1 | 3/2006 | Aratani et al. | |

FOREIGN PATENT DOCUMENTS

| | | |
|---|---|---|
| JP | 04-045584 | 2/1992 |
| JP | 6-232271 | 8/1994 |
| JP | 2003-115574 | 4/2003 |
| JP | 2003-303941 | 10/2003 |
| JP | 2006-019686 | 1/2006 |
| JP | 2006-019688 | 1/2006 |
| WO | WO 03/071614 A2 | 8/2003 |
| WO | WO 2004/057676 A2 | 7/2004 |

OTHER PUBLICATIONS

Japanese Office Action issued in Japanese Patent Application No. JP 2008-266779 dated Feb. 14, 2012.

*Primary Examiner* — A. Sefer
*Assistant Examiner* — Nikolay Yushin
(74) *Attorney, Agent, or Firm* — McDermott Will & Emery LLP

(57) ABSTRACT

A nonvolatile memory element comprising: a first electrode 2; a second electrode 6 formed above the first electrode 2; a variable resistance film 4 formed between the first electrode 2 and the second electrode 6, a resistance value of the variable resistance film 4 being increased or decreased by an electric pulse applied between the first and second electrodes 2, 6; and an interlayer dielectric film 3 provided between the first and second electrodes 2, 6, wherein the interlayer dielectric film 3 is provided with an opening extending from a surface thereof to the first electrode 2; the variable resistance film 4 is formed at an inner wall face of the opening; and an interior region of the opening which is defined by the variable resistance film 4 is filled with an embedded insulating film 5.

2 Claims, 32 Drawing Sheets

(a)

(b)

(a)

(b)

(a)

(b)

(a)

(b)

(c)

(d)

(a)

(b)

(c)

(d)

(a)

(b)

(c)

(d)

(a) 0.24 μmφ、H=150nm (b) 0.40 μmφ、H=150nm (c) 0.60 μmφ、H=150nm (a) 0.24 μmφ、H=350nm (b) 0.40 μmφ、H=350nm (c) 0.60 μmφ、H=350nm

OPENING DIAMETER OF CONTACT HOLE [μm]

(a)

(b)

(c)

(d)

(a)

(b)

(c)

(a)

(b)

NONVOLATILE MEMORY ELEMENT

RELATED APPLICATIONS

This application is a Divisional of U.S. application Ser. No. 12/295,500, filed on Sep. 30, 2008, now U.S. Pat. No. 7,884,346 which is a U.S. National Phase under 35 U.S.C. §371 of International Application No. PCT/JP2007/056424, filed on Mar. 27, 2007, which in turn claims the benefit of Japanese Application No. 2006-093988, filed on Mar. 30, 2006, the disclosures of which Applications are incorporated by reference herein.

TECHNICAL FIELD

The present invention relates to a nonvolatile memory element for storing data by use of a material the resistance of which is reversibly varied by application of electric pulses, and a manufacturing method thereof.

BACKGROUND ART

Recent developments in digital technologies have brought higher functionality to electronic hardware such as portable information devices and home information appliances. To keep pace with the trend of electronic hardware toward higher functionality and mobilization, miniaturization and power saving technologies for semiconductor elements for use in electronic hardware are making rapid progress. Above all, the market of flash memories, capable of storing vast amounts of data as a memory element, is rapidly expanding. However, it is thought that the miniaturization of flash memories will reach a limit in the near future because of the need to ensure the reliability of the gate oxide film. "Post-flash memories" that will replace the flash memories are resistance-change memories such as PCRAM (Phase Change RAM) and ReRAM (Resistive switching RAM). These memories incorporate, as a device film, a variable resistance film having such a characteristic that resistance can be changed by application of electric pulses. In particular, ReRAM is drawing attention as a cross-point type constituent device suited for miniaturization, and devices including a variable resistance film as a storage section have been proposed (see e.g., Patent Document 1). There have also been proposed elements that use a variable resistance film in combination with diodes (see e.g., Patent Document 2).

FIG. 26 is a sectional perspective view showing a major part of a first known cross-point type nonvolatile memory element (hereinafter referred to as "first prior art technique"). As illustrated in FIG. 26, the first prior art technique is provided with a plurality of first wires 101 that extend in a specified direction so as to be parallel to one another. Also, a plurality of second wires 102 are provided, extending so as to intersect the first wires 101. In each region where a first wire 101 and a second wire 102 intersect each other, a variable resistance film 103 is provided. Miniaturized cells and therefore a large capacity nonvolatile memory element can be achieved by employing the above cross-point configuration without use of selective transistors.

FIG. 27 is a sectional perspective view showing a major part of a second known nonvolatile memory element (hereinafter referred to as "second prior art technique"). As illustrated in FIG. 27, in the second prior art technique, first wires 104 and second wires 105 are provided so as to intersect each other. In each region where a first wire 104 and a second wire 105 intersect each other, a diode material 106 having a rectifying characteristic and a variable resistance film 107 are provided. Provision of a diode material in each cell of a cross-point configuration enables it to prevent a flow of sneak current into adjacent cells during read-out and write-in.
Patent Document 1: U.S. Pat. No. 6,850,429 Specification
Patent Document 2: U.S. Pat. No. 6,185,122 Specification

DISCLOSURE OF THE INVENTION

Problems that the Invention Intends to Solve

In the prior art nonvolatile memory elements described above, the resistance of the cells is determined by the material and film thickness of the variable resistance film and the area of electrodes (i.e., the area of the surface of the variable resistance film in contact with the electrodes). The cell resistance is an important parameter for designing a memory cell and is preferably equal to the resistance which is about 1 to 10 k$\Omega$, generated when the transistors are turned ON. If the cell resistance is lower than the above value, it will give rise to the following problems.

First, from the viewpoint of the device, the driving current flowing in the cells increases so that it becomes difficult to reduce power consumption. The increase in the driving current is undesirable because it leads to a decrease in the reliability of the nonvolatile memories of the cells as well as in the reliability of the contacts and wiring. In addition, if the resistance of the wiring connected to the cells increases, the voltage applied to the cells drops because the power supply voltage is divided according to a resistance ratio. As a result, satisfactory writing cannot be performed.

Secondly, the cell resistance is an important parameter for "forming" (imposing an electric stress to enable the element to increase or decrease its resistance value by application of an electric pulse) that is a phenomenon inherent to ReRAM. If the cell resistance is low, a large current will flow at the stage of imposing an electric stress during forming, which will give damage to the variable resistance film. This implies that electric current can be more easily controlled by a process in which forming starts when the variable resistance film is in a high resistance state, compared to a process in which forming starts when the variable resistance film is in a low resistance state.

In the above-described background, possible approaches to designing of an appropriate cell resistance without changing the material of the variable resistance film are as follows.

The first approach is such that the crystallinity, orientation and grain size of the variable resistance film are altered by changing the film formation temperature of the material of the variable resistance film or additionally applying a thermal treatment so that desired resistance is obtained. This approach, however, affects the resistance change characteristic. Accordingly, a good resistance change characteristic and a desirable cell resistance are not always compatible with each other.

The second approach is to change the dimension of the variable resistance film. The resistance of the cells can be raised by increasing the film thickness of the variable resistance film or reducing the area of the electrodes in contact with the variable resistance film. In the former case, the film thickness of the variable resistance film can be increased to about twice or three times that of an ordinary variable resistance film at a maximum, in view of manufacturing semiconductor and, to be precise, the minimum range (the thickness of the resist film and processing accuracy) to which the influence upon processing of the variable resistance film should be limited. In the case where the variable resistance film is embedded into a contact plug by plating and CMP (Chemical Mechanical Polishing), the film thickness can be increased to about five times. However, there has not be been developed yet a technique for applying the same process to a variable resistance film made of a transition metal oxide. In the latter case, that is, the case where the area of the electrode is reduced, the upper limit of the reduction of the area of the electrode is 10 to 20% of the normal area of the electrode as far as the manufacturing process is performed according to the same design rule. Under the circumstances, therefore, it is impossible to obtain cell resistance ten times that of the known nonvolatile memory elements even if both of the above approaches are combined.

The invention is directed to overcoming the above problems and an object of the invention is therefore to provide a nonvolatile memory element which is capable of achieving high cell resistance and increasing the flexibility of cell resistance design to thereby enable miniaturization and power savings, and a manufacturing method thereof.

Means of Solving the Problems

The above object can be accomplished by a nonvolatile memory element according to the invention, the memory element comprising: a first electrode; a second electrode formed above the first electrode; a variable resistance film formed between the first electrode and the second electrode, a resistance value of the variable resistance film being increased or decreased by an electric pulse applied between the first and second electrodes; and an interlayer dielectric film provided between the first and second electrodes, wherein the interlayer dielectric film is provided with an opening extending from a surface thereof to the first electrode and having a height which is not less than a thickness of the variable resistance film; the variable resistance film is formed at an inner wall face of the opening; an interior region of the opening which is defined by the variable resistance film is filled with an embedded insulating film and said element is configured not to flow a current in a portion other than the variable resistance film, when the electric pulse is applied between the first electrode and the second electrode.

With the above configuration, the effective electrode area in contact with the variable resistance film can be reduced and therefore high cell resistance can be attained. This leads to miniaturization and power savings.

According to the configuration of the invention, the cell resistance can be adjusted over a wider region compared to the prior art by adjusting the film thickness of the variable resistance film and the height of the opening. Since higher cell resistance can be obtained by reducing the film thickness of the variable resistance film, microfabrication and high resistance both can be easily attained. That is, the load on microfabrication of the variable resistance film can be reduced.

Preferably, in the nonvolatile memory element of the invention, a minimum film thickness of the embedded insulating film is greater than a minimum film thickness of the variable resistance film in a plan view.

In the nonvolatile memory element of the invention, the variable resistance film may be formed at the inner wall face and bottom face of the opening.

Preferably, in the nonvolatile memory element of the invention, the opening has a cylindrical shape and a product of a diameter of an opening plane of the opening and a height of the opening is no less than 40 times a square of a film thickness of the variable resistance film.

In the nonvolatile memory element of the invention, the opening may be groove-shaped; the variable resistance film may be formed at both inner wall faces of the groove-shaped opening; and two second electrodes may be provided and connected to the variable resistance films formed at the inner wall faces, respectively. Thereby, a multiple-value memory can be easily achieved.

Preferably, in the nonvolatile memory element of the invention, a product of a width of the groove-shaped opening and a height of the groove-shaped opening is no less than 10 times a square of the film thickness of the variable resistance film.

According to the invention, there is provided a nonvolatile memory element comprising:

a substrate;

a plurality of first wires formed on the substrate so as to extend in parallel with one another;

a plurality of second wires formed within a plane which is located above the plurality of first wires and is parallel to a main surface of the substrate, the second wires extending in parallel with one another and spatially intersecting the plurality of first wires; and a plurality of memory cells arranged in a matrix pattern so as to correspond to spatial intersection points, respectively, where the first and second wires spatially intersect, wherein each of the memory cells includes:

a first electrode that constitutes or is connected to the first wires;

a second electrode that is formed above the first electrode and that constitutes or is connected to the second wires;

a variable resistance film formed between the first electrode and the second electrode, a resistance value of the variable resistance film being increased or decreased by an electric pulse applied between the first and second electrodes; and an interlayer dielectric film provided between the first and second electrodes, wherein the interlayer dielectric film is provided with an opening extending from a surface thereof to the first electrode and having a height which is not less than a thickness of the variable resistance film; the variable resistance film is formed at an inner wall face of the opening; and an interior region of the opening which is defined by the variable resistance film is filled with an embedded insulating film and said element is configured not to flow a current in a portion other than the variable resistance film, when the electric pulse is applied between the first electrode and the second electrode.

Thereby, a cross-point type nonvolatile memory element can be achieved.

Preferably, in each memory cell of the nonvolatile memory element of the invention, a diode material having a rectifying characteristic is formed at a bottom face of the opening so as to be located between the variable resistance film and the first electrode. Alternatively, each memory cell of the nonvolatile memory element of the invention may be formed such that a diode material having a rectifying characteristic is formed at a top face of the opening so as to be located between the variable resistance film and the second electrode.

Each memory cell of the nonvolatile memory element of the invention may be formed such that the opening is groove-shaped; the variable resistance film is formed at both inner wall faces of the groove-shaped opening; and two second electrodes are provided and connected to the variable resistance films formed at the inner wall faces, respectively.

According to the invention, there is provided a method of manufacturing a nonvolatile memory element comprising:

the step (a) of forming a first wire on a substrate;

the step (b) of forming an interlayer dielectric film configured to cover the first wire;

the step (c) of forming a contact hole on the first wire so as to pierce through the interlayer dielectric film;

the step (d) of forming a variable resistance film over exposed faces of the interlayer dielectric film and the first wire;

the step (e) of removing the variable resistance film formed on the exposed faces so as to leave the variable resistance film formed on the inner wall face of the contact hole;

the step (f) of forming an embedded insulating film over exposed faces of the interlayer dielectric film, the first wire and the variable resistance film;

the step (g) of removing the embedded insulating film formed on the exposed faces so as to leave the embedded insulating film formed in an interior region of the contact hole which is defined by the variable resistance film; and the step (h) of forming a second wire on the variable resistance film.

In the step (e) of the method of manufacturing the nonvolatile memory element of the invention, the variable resistance film formed on the exposed faces is removed so as to leave the variable resistance film formed on an inner wall face and a bottom face of the contact hole may.

The method of manufacturing the nonvolatile memory element of the invention may further comprise the step (i) of forming a diode material having a rectifying characteristic between the variable resistance film and the first wire or between the variable resistance film and the second wire.

According to the invention, there is provided a method of manufacturing a nonvolatile memory element comprising:

the step (a) of forming a first wire on a substrate;

the step (b) of forming an interlayer dielectric film configured to cover the first wire;

the step (c) of forming a contact hole on the first wire so as to pierce through the interlayer dielectric film;

the step (d) of forming a variable resistance film over exposed faces of the interlayer dielectric film and the first wire;

the step (e) of forming an embedded insulating film over exposed faces of the interlayer dielectric film;

the step (f) of removing the embedded insulating film formed on the exposed faces and removing the variable resistance film formed on the exposed faces so as to leave the variable resistance film formed on an inner wall face and a bottom face of the contact hole and so as to leave the embedded insulating film formed in an interior region of the contact hole which is defined by the variable resistance film; and the step (g) of forming a second wire on the variable resistance film.

According to the invention, there is provided a method of manufacturing a nonvolatile memory element comprising:

the step (a) of forming a first wire on a substrate;

the step (b) of forming an interlayer dielectric film configured to cover the first wire;

the step (c) of forming a groove-shaped opening on the first wire so as to pierce through the interlayer dielectric film;

the step (d) of forming a variable resistance film over exposed faces of the interlayer dielectric film and the first wire;

the step (e) of removing the variable resistance film formed on the exposed faces so as to leave the variable resistance film formed on both inner wall faces of said opening;

the step (f) of forming an embedded insulating film over exposed faces of the interlayer dielectric film, the first wire and the variable resistance film;

the step (g) of removing the embedded insulating film formed on the exposed faces so as to leave the embedded insulating film formed in an interior region of the contact hole which is defined by the variable resistance film; and the step (h) of forming a second wire on the variable resistance film.

BRIEF DESCRIPTION OF DRAWINGS

FIG. 8(a) is a sectional view showing the configuration of the nonvolatile memory element according to the first embodiment of the invention, whereas FIG. 8(b) is a sectional view showing the configuration of a known nonvolatile memory element.

FIG. 14A(b) is a sectional view showing the step of forming an interlayer dielectric film; FIG. 14A(c) is a sectional view showing the step of forming a contact hole; and FIG. 14A(d) is a sectional view showing the step of forming a variable resistance film.

FIG. 14B(b) is a sectional view showing the step of forming an embedded insulating film; FIG. 14B(c) is a sectional view showing the step of polishing the embedded insulating film; and FIG. 14B(d) is a sectional view showing the step of forming a second wire.

FIG. 15A(b) is a sectional view showing the step of forming an interlayer dielectric film; FIG. 15A(c) is a sectional view showing the step of forming a contact hole; and FIG. 15A(d) is a sectional view showing the step of forming a variable resistance film.

FIG. 15B(b) is a sectional view showing the step of forming an embedded insulating film; FIG. 15B(c) is a sectional view showing the step of polishing the embedded insulating film; and FIG. 15(d) is a sectional view showing the step of forming a second wire.

FIG. 16A(b) is a sectional view showing the step of forming an interlayer dielectric film; FIG. 16A(c) is a sectional view showing the step of forming a contact hole; and FIG. 16A(d) is a sectional view showing the step of forming a variable resistance film.

FIG. 16B(b) is a sectional view showing the step of planarization; FIG. 16B(c) is a sectional view showing the step of etching the embedded insulating film; and FIG. 16B(d) is a sectional view showing the step of forming a second wire.

FIG. 23A(b) is a sectional view showing the step of forming an interlayer dielectric film; FIG. 23A(c) is a sectional view showing the step of forming a contact hole; and FIG. 23A(d) is a sectional view showing the step of forming a variable resistance film.

FIG. 23B(b) is a sectional view showing the step of forming an embedded insulating film; FIG. 23B(c) is a sectional view showing the step of polishing the embedded insulating film; and FIG. 23B(d) is a sectional view showing the step of forming a second wire.

FIG. 24A(b) is a sectional view showing the step of forming an interlayer dielectric film; FIG. 24A(c) is a sectional view showing the step of forming a contact hole; and FIG. 24A(d) is a sectional view showing the step of forming a variable resistance film.

FIG. 24B(b) is a sectional view showing the step of forming an embedded insulating film; FIG. 24B(c) is a sectional view showing the step of forming a recess; and FIG. 24B(d) is a sectional view showing the step of forming a diode material.

FIG. 24C(b) is a sectional view showing the step of forming a second wire.

FIG. 25A(b) is a sectional view showing the step of forming an interlayer dielectric film; FIG. 25A(c) is a sectional view showing the step of forming a groove-shaped opening; and FIG. 25A(d) is a sectional view showing the step of forming a variable resistance film.

FIG. 25B(b) is a sectional view showing the step of forming an embedded insulating film; FIG. 25B(c) is a sectional view showing the step of polishing the embedded insulating film; and FIG. 25B(d) is a sectional view showing the step of forming a second wire.

EXPLANATION OF REFERENCE NUMERALS

Figure 1A:
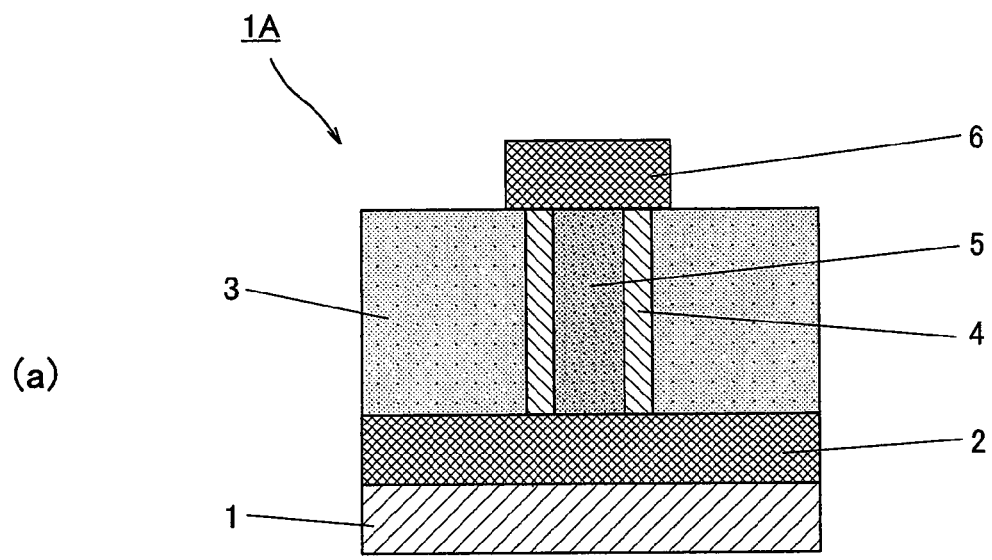
FIG. 1A(a) is a sectional view showing the configuration of a nonvolatile memory element according to a first embodiment of the invention, and FIG. 1A(b) is a plan view thereof.
Figure 1A:
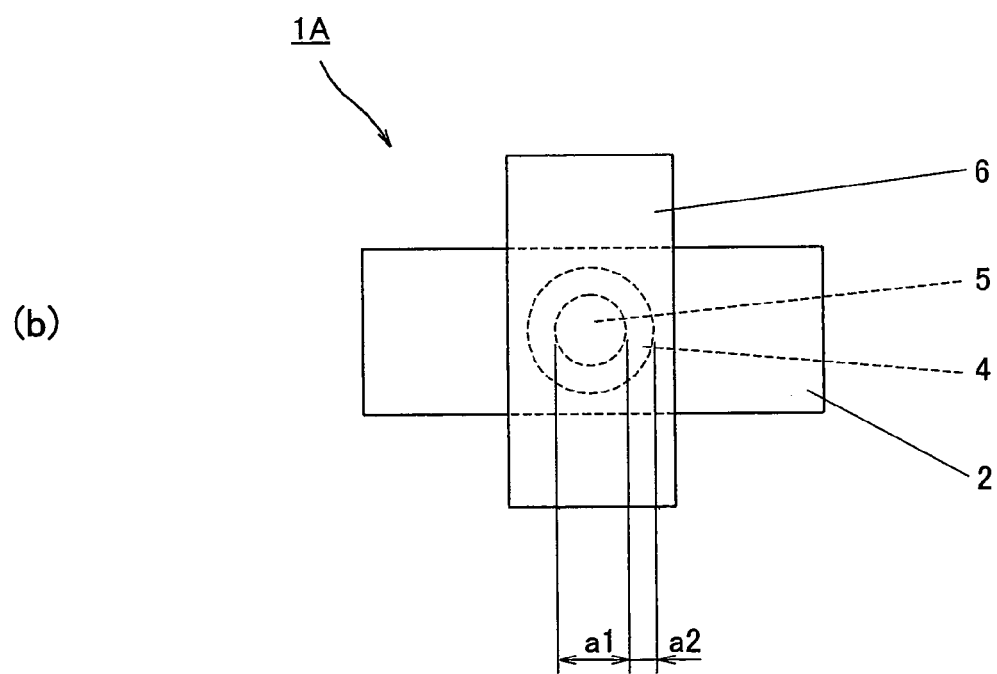

1: substrate
1A to 1I: nonvolatile memory element
2: first electrode
3: interlayer dielectric film
4, 4a, 4b: variable resistance film
5: embedded insulating film
6: second electrode
7: first wire
8: second wire
9: diode
10a, 10b: second electrode
11a, 11b: second wire
12: hole-like opening in the interlayer dielectric film
13: groove-shaped opening in the interlayer dielectric film
14: recess of opening in the interlayer dielectric film
101: first wire
102: second wire
103: variable resistance film
104: first wire
105: second wire
106: diode material
107: variable resistance film

BEST MODE FOR CARRYING OUT THE INVENTION

Referring now to the accompanying drawings, a nonvolatile memory element and a manufacturing method thereof will be described according to embodiments of the invention. Throughout the drawings, the same reference numerals are assigned to the same parts and description therefor is sometimes omitted. For the sake of convenience, some parts are partially enlarged in the drawings.

First Embodiment

Configuration of Nonvolatile Memory Element

FIG. 1A($a$) is a sectional view showing the configuration of a nonvolatile memory element according to a first embodiment of the invention, and FIG. 1A($b$) is a plan view thereof.

As illustrated in FIGS. 1A($a$), 1A($b$), the nonvolatile memory element 1A of the first embodiment has a first electrode 2 (Cu/TaN) formed on a substrate 1 and a second electrode 6 (Cu/TaN) formed above the first electrode 2. Interposed between the first electrode 2 and the second electrode 6 is an interlayer dielectric film 3 ($SiO_2$, having a film thickness of 500 nm in section). This interlayer dielectric film 3 has contact holes (diameter=250 nm) that are cylindrical openings extending from the surface of the interlayer dielectric film 3 to the first electrode 2. Each contact hole is provided on an inner wall face thereof with a variable resistance film 4 ($Fe_3O_4$, having a film thickness of 10 nm). An embedded insulating film 5 ($SiO_2$) is filled in the interior region of the contact hole which is defined by the variable resistance film 4.

As seen from FIG. 1A($b$), the film thickness a1 of the embedded insulating film 5 is greater than the film thickness a2 of the variable resistance film 4 in a plan view (i.e., a1>a2).

Generally, resistance is given by the equation (the resistivity of material×distance/sectional area). Herein, the resistivity of $Fe_3O_4$ is as low as 10 mΩ·cm. The distance is given by the height of the contact hole (i.e., the film thickness of the interlayer dielectric film 3 in a sectional view) and therefore 500 nm in this embodiment, which is 50 times the film thickness of the variable resistance film 4. Among the area of the contact hole, the region in which the embedded insulating film 5 is filled is not included in the sectional area and therefore, the sectional area is the region of only the variable resistance film 4 which takes the form of a ring in a plan view. The sectional area is represented by $\pi(250\ nm/2)^2-\pi\{(250\ nm-20\ nm)/2\}^2=7536\ nm^2$, which is about 7.8% of the area of the contact hole. By assigning these values to the above equation, the cell resistance is found to be about 7 kΩ, which is an order suited for memory cell design. As has been discussed, even if a material having low resistivity is used, a nonvolatile memory element having desired high cell resistance can be obtained so that miniaturization and power savings can be realized.

In view of affinity in the wiring process of the semiconductor, the first and second electrodes of the first embodiment and other embodiments described later both have a double-layer structure composed of Cu (upper layer) and TaN (lower layer) which are also used as wiring material. However, the first and second electrodes may be made of different electrode materials. Although the second electrode is formed on a flat region constituted by the contact hole and the interlayer dielectric film, it could be placed within the contact hole, that is, it could be formed in the upper interior part of the contact hole. Although the contact hole is oriented perpendicularly to the first electrode located therebeneath, it may be tilted at a specified angle to the first electrode.

Figure 1B:
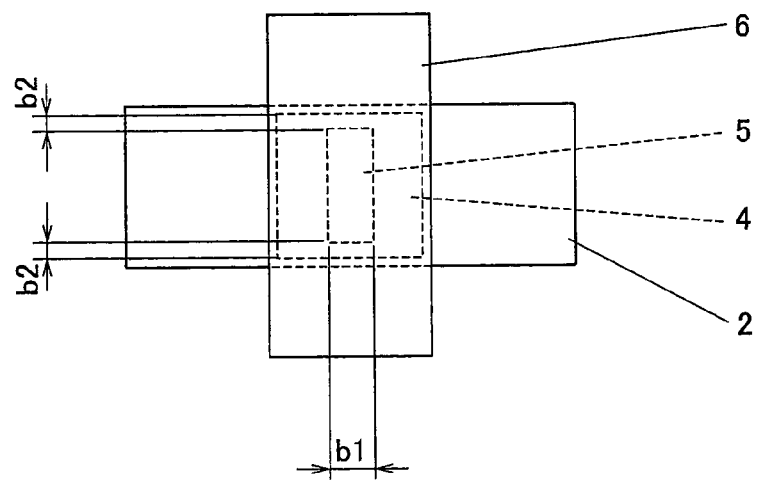
FIG. 1B is a sectional view showing the configuration of a modification of the nonvolatile memory element according to the first embodiment of the invention.

Although the contact hole formed in the interlayer dielectric film 3 according to the first embodiment is circular in section and the ring-shaped variable resistance film is formed on the inner wall face thereof as illustrated in FIGS. 1A($a$), 1A($b$), the invention is not necessarily limited to this. For example, the contact hole may have a rectangular cross-sectional shape as illustrated in FIG. 1B and the variable resistance film 4 may be formed on the inner wall face thereof so as to define the interior region having a rectangular cross-sectional shape in which the embedded insulating film 5 is filled. However, even in this case, the minimum film thickness b1 of the embedded insulating film 5 in a plan view must be larger than the minimum film thickness b2 of the variable resistance film 4.

(Manufacturing Method of Nonvolatile Memory Element)

Next, a manufacturing method for the nonvolatile memory element 1A of the first embodiment of the above configuration will be explained.

Figure 14A:
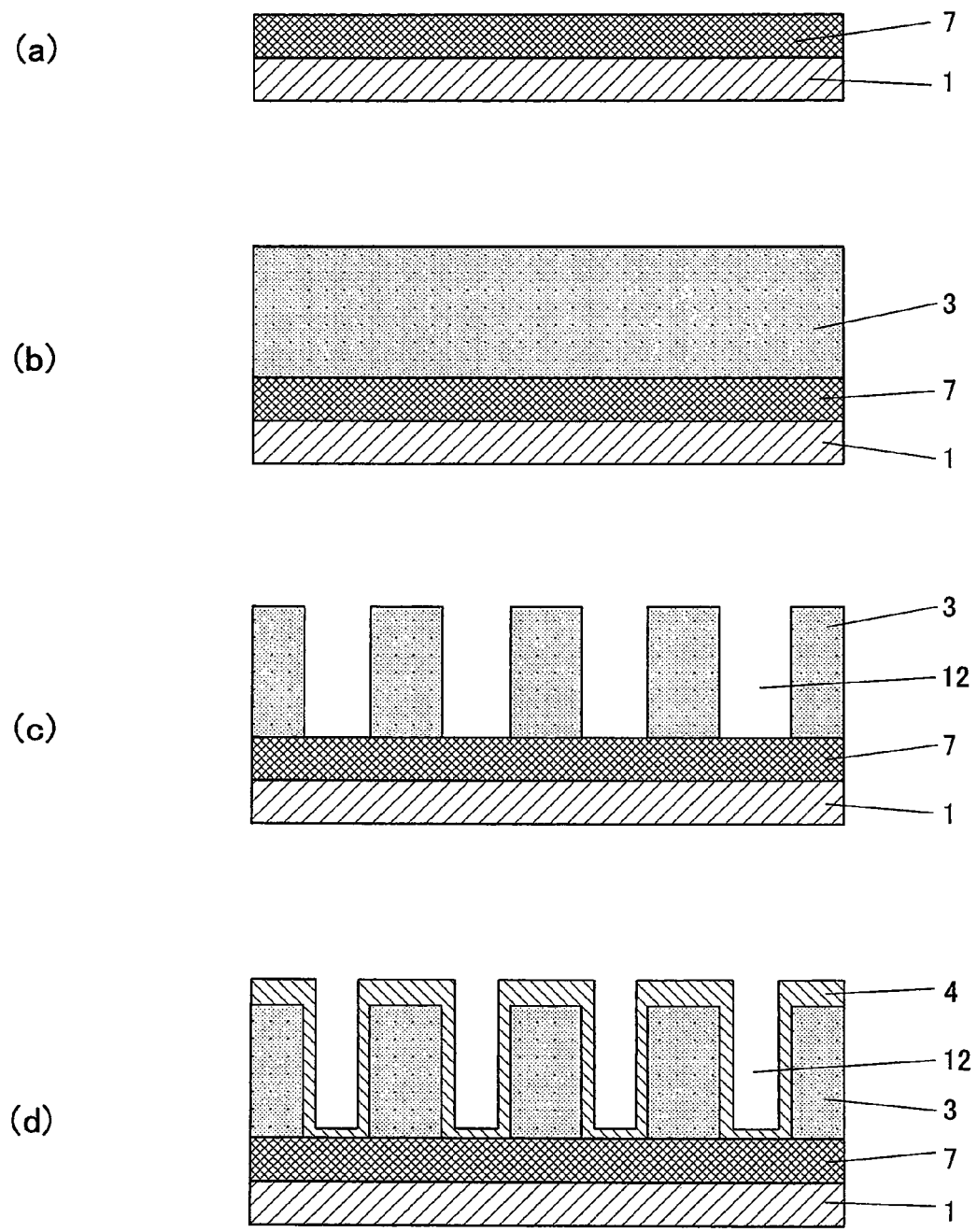
FIG. 14A is diagrams each showing a step in a manufacturing method of the nonvolatile memory element according to the first embodiment of the invention, wherein FIG. 14A(a) is a sectional view showing the step of forming a first wire.
Figure 14B:
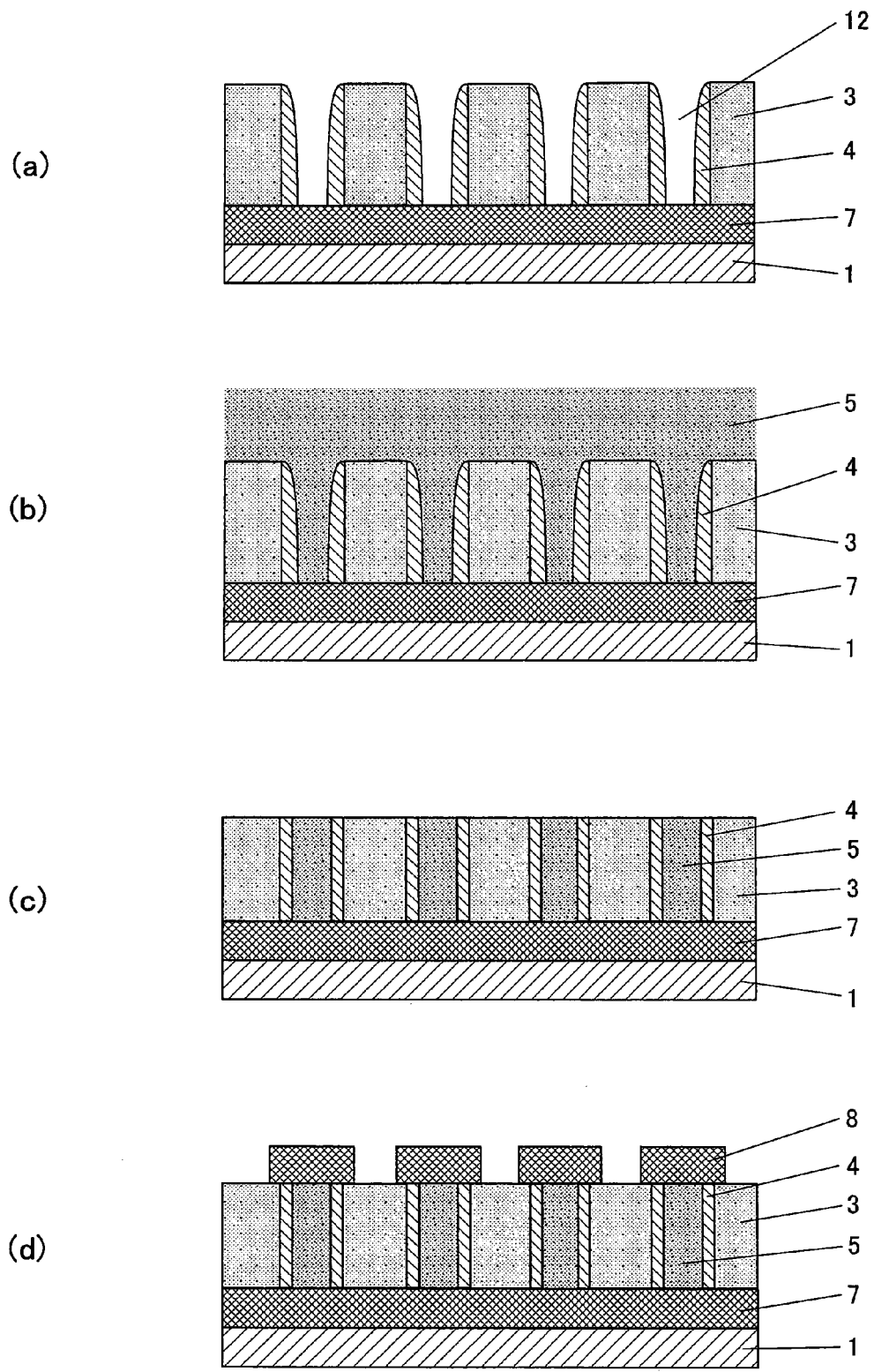
FIG. 14B is diagrams each showing a step in the manufacturing method of the nonvolatile memory element according to the first embodiment of the invention, wherein FIG. 14B(a) is a sectional view showing the step of removing the variable resistance film on the interlayer dielectric film.

FIGS. 14A($a$) to 14A($d$) and FIGS. 14B($a$) to 14B($d$) are sectional views each showing a step in the method of manufacturing the nonvolatile memory element according to the first embodiment of the invention.

In the step shown in FIG. 14A($a$), a plurality of first wires 7 (that correspond to the first electrode 2 in FIG. 1A($a$)), composed of a close contact layer TaN and a main portion Cu material (Cu/TaN=180 nm/20 nm) which are stacked in this order, are formed on the substrate 1 so as to extend in a specified direction. The first wires 7 have a width of 300 nm and thickness of 200 nm. The formation of the first wires (Cu/TaN) 7 may be carried out with the damascene process performed in such a manner that after a groove for a wiring to be embedded is formed in the insulating film, a TaN film and Cu film are formed by sputtering and plating, respectively, and then the wiring material is embedded by CMP (Chemical Mechanical Polishing).

Next, in the step shown in FIG. 14A($b$), an F-doped oxide film is deposited by a CVD process or the like and then, a 550 nm-thick interlayer dielectric film 3 is formed by CMP.

Then, in the step shown in FIG. 14A(c), cylindrical contact holes 12 having a diameter of 250 nm are formed by dry etching so as to pierce through the inter dielectric film 3 to the first wires 7.

Thereafter, in the step shown in FIG. 14A(d), the variable resistance film 4 made of a transition metal oxide film material such as $FeO_x$ is formed by sputtering on the exposed faces of the interlayer dielectric film 3 and the first wires 7. At that time, the film thickness of the variable resistance film to be formed should be determined taking account of step coatability associated with sputtering. If step coatability (represented by the ratio between the inner wall face and the flat area) is 10%, a 100 nm-thick variable resistance film is formed in the flat region. In this case, the variable resistance film formed on the inner wall face of each contact hole is 10 nm in thickness. In this process, if it is desired to minimize the film thickness (in a plan view) of the inner wall, sputtering is preferably used. On the other hand, if it is desired to ensure a certain degree of film thickness in the inner wall, CVD is preferable, because it provides good step coatability.

Then, in the step shown in FIG. 14B(a), all the exposed faces are etched back to thereby remove the variable resistance film 4 formed on the interlayer dielectric film 3. At that time, the variable resistance film at the bottom faces of the contact holes 12 is removed by etching back, whereas the variable resistance film 4 on the inner wall faces of the contact holes 12 takes the form of a side wall in a self-alignment manner.

Then, in the step shown in FIG. 14B(b), the embedded insulating film 5 comprised of an F (fluorine)-doped oxide film is deposited by CVD or the like so as to have a thickness of 400 nm. Since the diameter of the contact holes is 250 nm, the contact holes 12 are filled with the embedded insulating film 5 by depositing the 400 nm-thick embedded insulating film 5 in this way.

In this case, the embedded insulating film 5 grows from the inner wall faces (where the variable resistance film 4 is formed) of the contact holes 12 so that the interior region of each contact hole 12 defined by the variable resistance film 4 is filled with the embedded insulating film 5. Since the sidewall shape in the present process flow is such that the film thickness of the variable resistance film 4 in section tends to decrease as it is closer to the top part of the contact hole 12, the contact hole tends to open wider at the upper part. Therefore, each contact hole 12 can be filled with the embedded insulating film 5 without creating voids.

Then, the embedded insulating film 5 is polished by CMP as shown in FIG. 14B(c) so as to leave the embedded insulating film 5 within the contact holes only. In this case, it is preferable to polish the underlaid interlayer dielectric film 3 by approximately 50 nm by CMP. The purpose of this is to expose the variable resistance film 4 formed on the inner wall faces of the contact holes without fail. By polishing the upper part of the side-wall-like variable resistance film 4, the difference in the film thickness of the variable resistance film between the upper part and lower part of each contact hole, that is, variations in the inner wall thickness are reduced.

Finally, as shown in FIG. 14B(d), a plurality of second wires 8 (that correspond to the second electrode 6 in FIG. 1A(a)), composed of a close contact layer TaN and a main portion Cu material (Cu/TaN=180 nm/20 nm) which are stacked in this order, are formed so as to extend in a specified direction. The second wires 8 have a width of 300 nm and thickness of 200 nm. The second wires 8 are formed so as to close the top of the contact holes and to intersect the first wires 7. Similarly to the formation of the first wires 7, the formation of the second wires 8 may be carried out with the damascene process in which after a groove for a wiring to be embedded is formed in the interlayer insulating film (not shown), a TaN film and Cu film are formed by sputtering and plating, respectively, and then the wiring material is embedded by CMP.

(Operation of Nonvolatile Memory Element)

Next, the operation of the nonvolatile memory element 1A will be described.

In the nonvolatile memory element 1A, a first specified electric pulse (electric current pulse or voltage pulse) is applied between the first electrode 2 (the first wires 7) and the first electrode 6 (the first wires 8). In this case, an electric pulse is applied to the variable resistance film 4 disposed between the first electrode 2 and the second electrode 6. Thereby, the variable resistance film 4 comes to have a first specified resistance value and keeps this state. When a second specified electric pulse is applied between the first electrode 2 and the second electrode 6 in this state, the resistance value of the variable resistance film 4 is then changed to a second specified resistance value and the variable resistance film 4 keeps this state.

Herein, the first and second specified resistance values are made to correspond to, for example, the two values, respectively, of binary data. This enables it to write the binary data in the nonvolatile memory element 1A by applying the first or second specified electric pulse to the variable resistance film 4. In addition, a voltage or current, which does not cause a change in the resistance value of the variable resistance film 4, is supplied to the nonvolatile memory element 1A to thereby detect the resistance value, whereby the binary data written in the nonvolatile memory element 1A can be read out.

In this way, the variable resistance film 4 disposed between the first electrode 2 and the second electrode 6 functions as a storage section.

(Processes for Providing Higher Resistance Cells)

High-resistance cells achieved by the nonvolatile memory element of the first embodiment will be hereinafter described in comparison with a known device.

Figure 8:
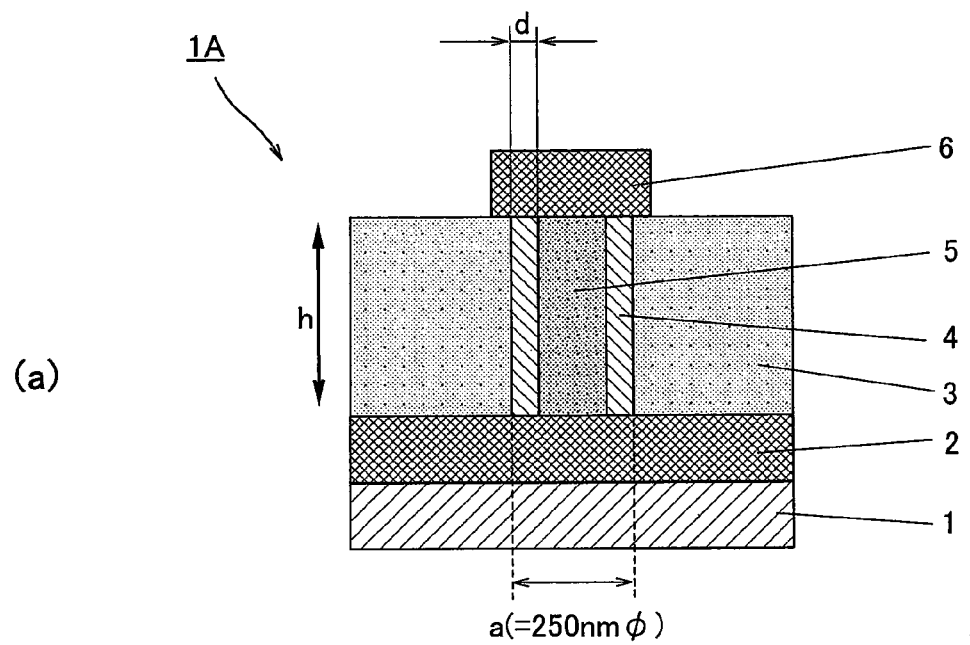
Figure 8:
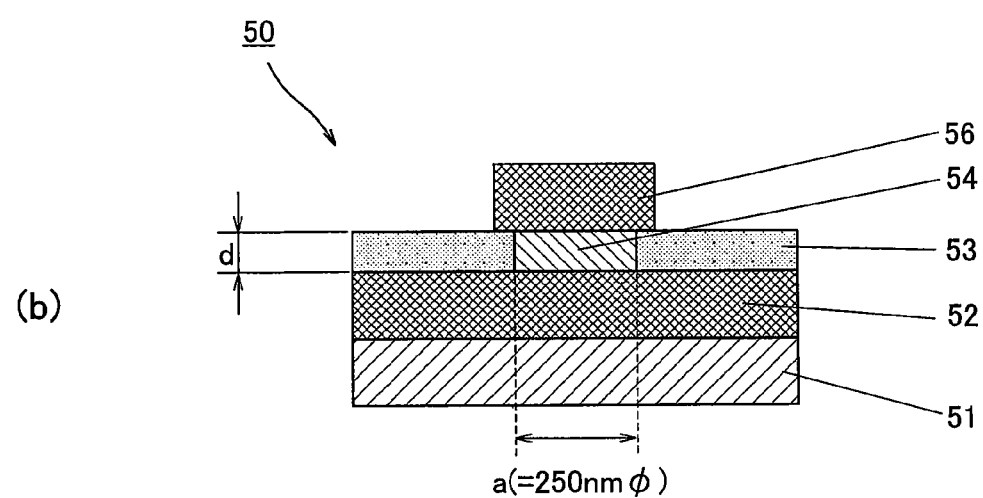

FIG. 8(a) is a sectional view showing the configuration of the nonvolatile memory element according to the first embodiment of the invention, whereas FIG. 8(b) is a sectional view showing the structure of a known nonvolatile memory element.

The configuration of the nonvolatile memory element of the first embodiment has been described already and therefore an explanation thereof is omitted herein. In the following description, the diameter and height of a contact hole are designated by a and h respectively as shown in FIG. 8(a). The film thickness of the variable resistance film 4 formed on the inner wall face of the contact hole is designated by d.

In the known nonvolatile memory element 50, as shown in FIG. 8(b), a first electrode 52 is formed on a substrate 51 and a variable resistance film 54 having a film thickness d is formed on the first electrode 52. The variable resistance film 54 is disposed only within the area of the circle having the diameter a, in order to make the comparative evaluation under the condition that the first embodiment and the known memory element have the same cell area. An interlayer dielectric film 53 is formed in other regions than the variable resistance film 54 and a second electrode 56 is formed on the variable resistance film 54.

As discussed earlier, resistance is calculated from the equation (the resistivity of material×distance/sectional area). Where the resistivity of the variable resistance film is $\rho$, the cell resistance R0 of the known nonvolatile memory element 50 shown in FIG. 8(b) is given by the following equation.

$$R0 = \rho \times d / \pi \times (a/2)^2$$
$$= 4\rho d / \pi a^2$$

On the other hand, the cell resistance R1 of the nonvolatile memory element 1A of the first embodiment shown in FIG. 8(a) is given by the following equation.

$$R1 = \rho \times h / [\pi \times (a/2)^2 - \pi \times \{(a-2d)/2\}^2]$$
$$= 4\rho h / \pi(4ad - d^2)$$

Therefore, the rate of increase of resistance ΔR is calculated as follows.

$$\Delta R = R1 / R0$$
$$= a^2 h / d^2 (4a - d)$$
$$= ah / d^2 (4 - d/a)$$

Since the film thickness d (5 to 20 nm) of the variable resistance film is small enough, compared to the diameter a (50 to 300 nm) of the contact hole, 4>>d/a holds. Therefore, ΔR is approximated by:

$$\Delta R \sim ah/4d^2.$$

Herein, the following relationship is derived from the above formula if the goal is the rate of increase of resistance ΔR having a value "no less than 10 times the cell resistance of the known memory element" which is difficult to achieve in some cases depending upon the increased film thickness of the variable resistance film and the decreased area of the electrodes.

$$ah \geq 40d^2$$

In short, it is desirable to meet the relationship in which the product of the diameter of the contact hole which is an opening and the height of the contact hole be no less than 40 times the square of the film thickness of the variable resistance film.

The rate of increase of resistance ΔR is simulated under the condition that the height h of the contact hole and the film thickness d of the variable resistance film are variables, the resistivity of $Fe_3O_4$ is 10 mΩ·cm, and the diameter a of the contact hole is 250 nm. The result of this simulation is summed up in FIGS. 9 and 10.

Figure 9:
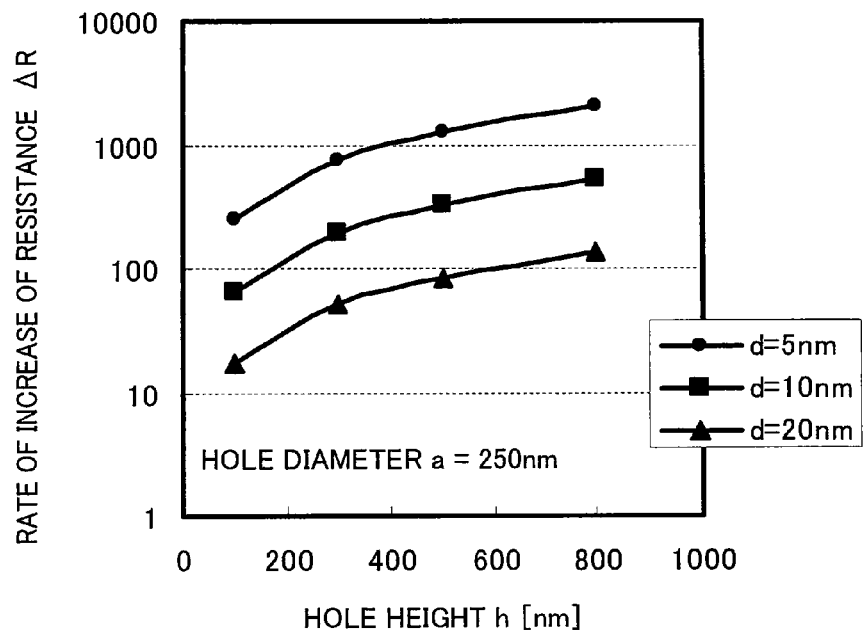
FIG. 9 is a graph showing the relationship between rate of increase of resistance and hole height.
Figure 10:
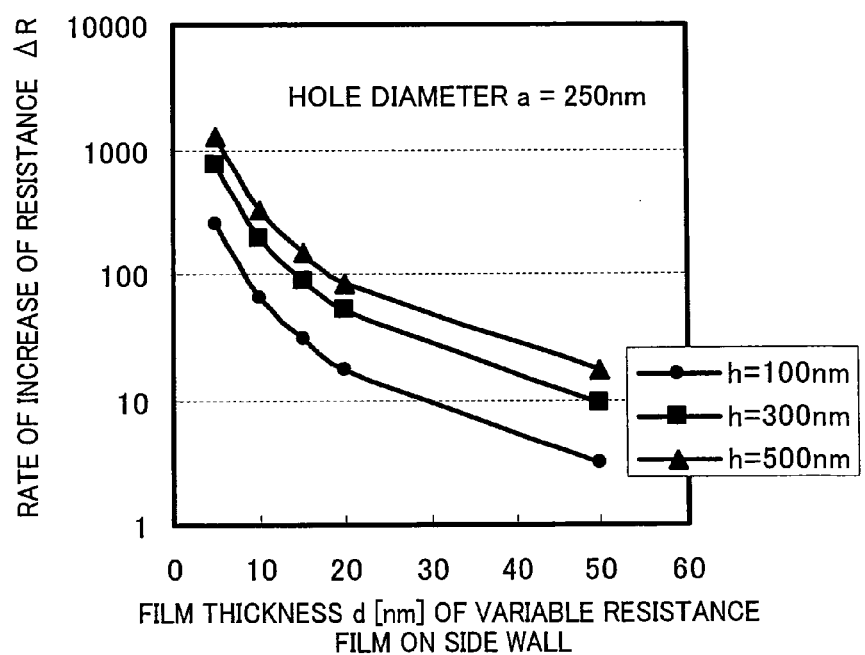
FIG. 10 is a graph showing the relationship between rate of increase of resistance and the film thickness of a variable resistance film.

FIG. 9 is a graph showing the relationship between the rate of increase of resistance ΔR and the hole height h. FIG. 10 is a graph showing the relationship between the rate of increase of resistance ΔR and the film thickness d of the variable resistance film. In FIG. 9, the line connecting the points marked with a circle indicates the case where the film thickness of the variable resistance film is 5 nm; the line connecting the points marked with a square indicates the case where the film thickness of the variable resistance film is 10 nm; and the line connecting the points marked with a triangle indicates the case where the film thickness of the variable resistance film is 20 nm. In FIG. 10, the line connecting the points marked with a circle indicates the case where the height of the hole is 100 nm; the line connecting the points marked with a square indicates the case where the height of the hole is 300 nm; and the line connecting the points marked with a triangle indicates the case where the height of the hole is 500 nm. It is understood from these figures that the rate of increase of resistance ΔR can be adjusted within the range of 10 fold to 1000 fold when the diameter d and the height h fall within their respective practical ranges (d=5 to 20 nm, h=100 to 800 nm). Further, it is understood that the rate of increase of resistance within the range of 10 to 100 fold and the rate of increase of resistance within the range of 100 to 1000 fold are set by properly determining the film thickness of the variable resistance film and the height of the contact hole, respectively, so that the cell resistance can be accurately designed.

Second Embodiment

In the nonvolatile memory element of the first embodiment, the variable resistance film is formed on only the inner wall faces of the contact holes. In contrast with this, in the nonvolatile memory element of the second embodiment, the variable resistance film is formed on not only the inner wall faces of the contact holes in a similar manner but also the bottom faces of the contact holes.

(Configuration of Nonvolatile Memory Element)

Figure 2:
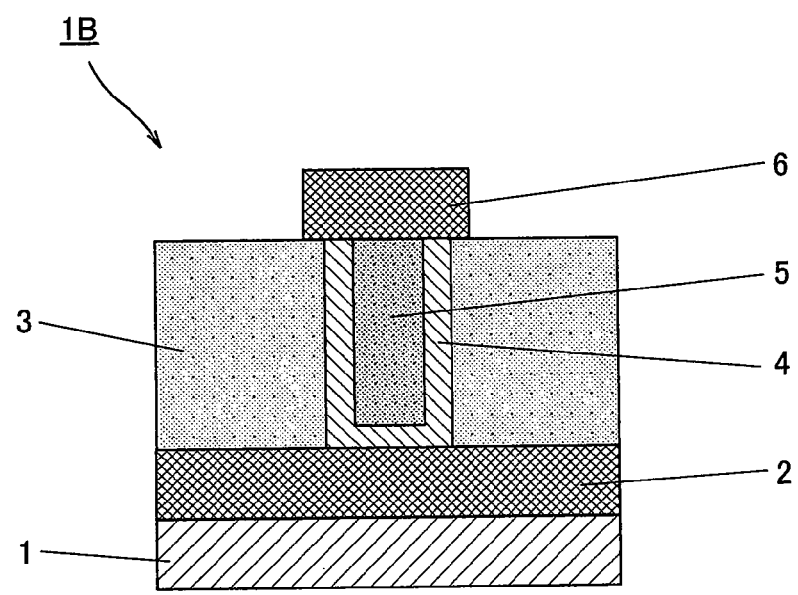
FIG. 2 is a sectional view showing the configuration of a nonvolatile memory element according to a second embodiment of the invention.

FIG. 2 is a sectional view showing the configuration of a nonvolatile memory element according to a second embodiment of the invention. As illustrated in FIG. 2, the nonvolatile memory element 1B of the second embodiment has the first electrode 2 (Cu/TaN) formed on the substrate 1 and the second electrode 6 (Cu/TaN) formed above the first electrode 2. Interposed between the first electrode 2 and the second electrode 6 is the interlayer dielectric film 3 ($SiO_2$, having a film thickness of 500 nm in section). This interlayer dielectric film 3 has contact holes (diameter=250 nm) that are openings each extending from the surface of the interlayer dielectric film 3 to the first electrode 2. Each contact hole is provided on an inner wall face thereof with a variable resistance film 4 ($Fe_3O_4$, having a film thickness of 10 nm). The variable resistance film 4 is formed on the bottom face of the contact hole. Thereby, the first electrode 2 within the contact hole is covered with the variable resistance film 4. An embedded insulating film 5 ($SiO_2$) is filled in the interior region of the contact hole which is defined by the variable resistance film 4.

Unlike the first embodiment, the variable resistance film 4 is thus formed on the bottom face of each contact hole in the nonvolatile memory element 1B of the second embodiment. However, this variable resistance film portion does not substantially contribute to the sectional area that determines the cell resistance. Therefore, the nonvolatile memory element 1B of the second embodiment can have a desired high cell resistance like the first embodiment and, in consequence, achieve miniaturization and power savings.

(Manufacturing Method of Nonvolatile Memory Element)

Next, manufacturing method for the nonvolatile memory element 1B of the second embodiment of the above configuration will be explained.

(First Manufacturing Method)

Figure 15A:
FIG. 15A is diagrams each showing a step in a first manufacturing method of the nonvolatile memory element according to the second embodiment of the invention, wherein FIG. 15A(a) is a sectional view showing the step of forming a first wire.
Figure 15A:
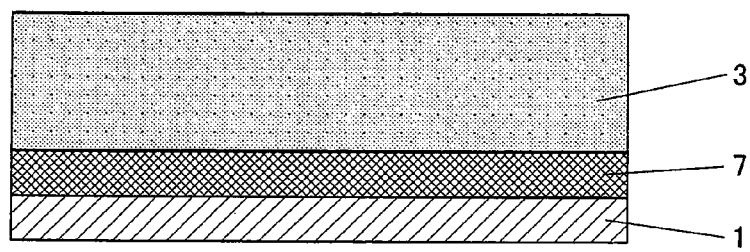
Figure 15A:
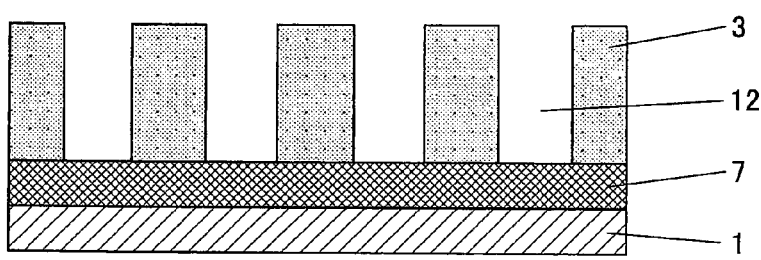
Figure 15A:
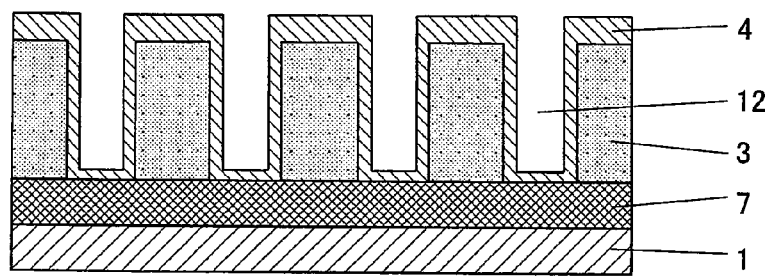
Figure 15B:
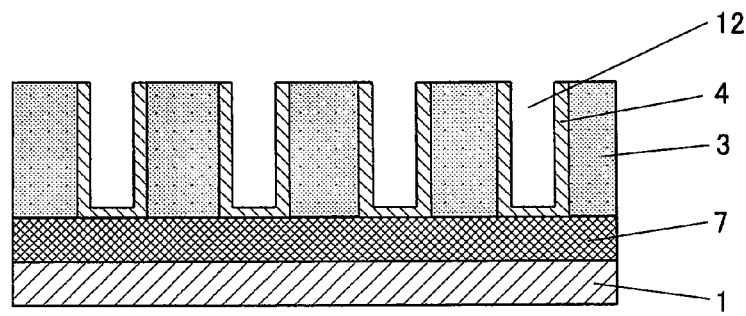
FIG. 15B is diagrams each showing a step in the first manufacturing method of the nonvolatile memory element according to the second embodiment of the invention, wherein FIG. 15B(a) is a sectional view showing the step of removing the variable resistance film on the interlayer dielectric film.
Figure 15B:
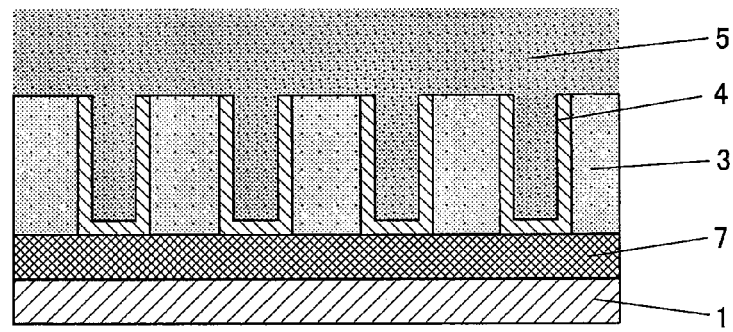
Figure 15B:
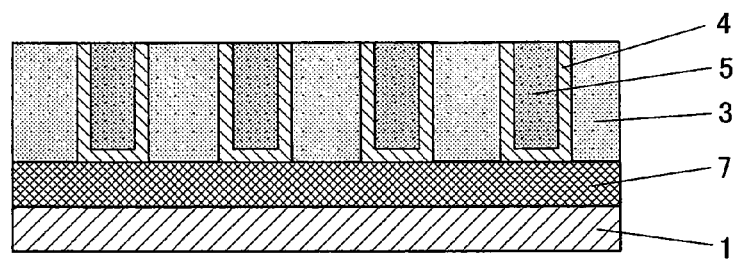
Figure 15B:
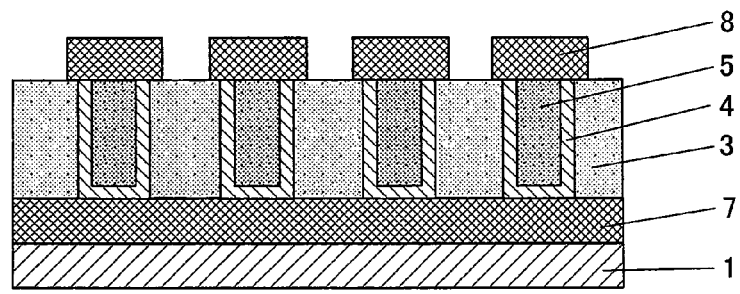

FIGS. 15A(a) to 15A(d) and FIGS. 15B(a) to 15B(d) are sectional views each showing a step in a first manufacturing method of the nonvolatile memory apparatus according to the second embodiment of the invention. The steps shown in FIGS. 15A(a) to 15A(d) are the same as of FIGS. 14A(a) to 14A(d) of the first embodiment and therefore an explanation thereof is omitted.

In the step shown in FIG. 15B(a), the variable resistance film 4 on the interlayer dielectric film 3 is removed by polishing the variable resistance film 4 by CMP. At that time, the variable resistance film 4 on the bottom faces and inner wall faces of the contact holes is left without being polished. If CMP, which provides poor in a plan view uniformity compared to the dry-etching technique, is employed, it is advisable to make the film thickness of the variable resistance film 4 as small as possible, namely, 50 nm or less to reduce the amount of polishing. In addition, CMP has an advantage in manufacturing method because it does not require accurate processing of the variable resistance film 4 within the contact holes, unlike the etch back process. Further, in the case of polishing by CMP, the variable resistance film 4 remaining in the contact holes is not directly processed and therefore process damage can be more reliably prevented compared to the etch back process described above.

Then in the step shown in FIG. 15B(*b*), the embedded insulating film 5 composed of an F (fluorine)-doped oxide film is deposited by a CVD process or the like so as to have a thickness of 400 nm. Since the diameter of the contact holes is 250 nm, the contact holes are filled with the embedded insulating film 5 by depositing the 400 nm-thick embedded insulating film 5 in this way.

In this case, the embedded insulating film grows from the inner wall faces (where the variable resistance film 4 is formed) of the contact holes and the interior regions of the contact holes defined by the variable resistance film 4 are filled with the embedded insulating film 5.

Then, the embedded insulating film 5 is polished by CMP as shown in FIG. 15B(*c*) so as to leave the embedded insulating film 5 in the contact holes only. In this case, it is desirable to polish the underlaid interlayer dielectric film 3 by approximately 50 nm by CMP. The purpose of this is to expose the variable resistance film 4 formed on the inner wall faces of the contact holes without fail.

Finally, as shown in FIG. 15B(*d*), a plurality of second wires 8 (that correspond to the second electrode 6 in FIG. 2) composed of a close contact layer TaN and a main portion Cu material (Cu/TaN=180 nm/20 nm) which are stacked in this order, are formed so as to extend in a specified direction. These wires 8 have a width of 300 nm and thickness of 200 nm. The second wires 8 are formed so as to close the top of the contact holes and to intersect the first wires 7.

As has been described, unlike the first embodiment, the second embodiment does not need to remove the variable resistance film 4 on the bottom faces of the contact holes which is generally difficult to remove and therefore advantageously makes it easy to manufacture nonvolatile memory element.

(Second Manufacturing Method)

Figure 16A:
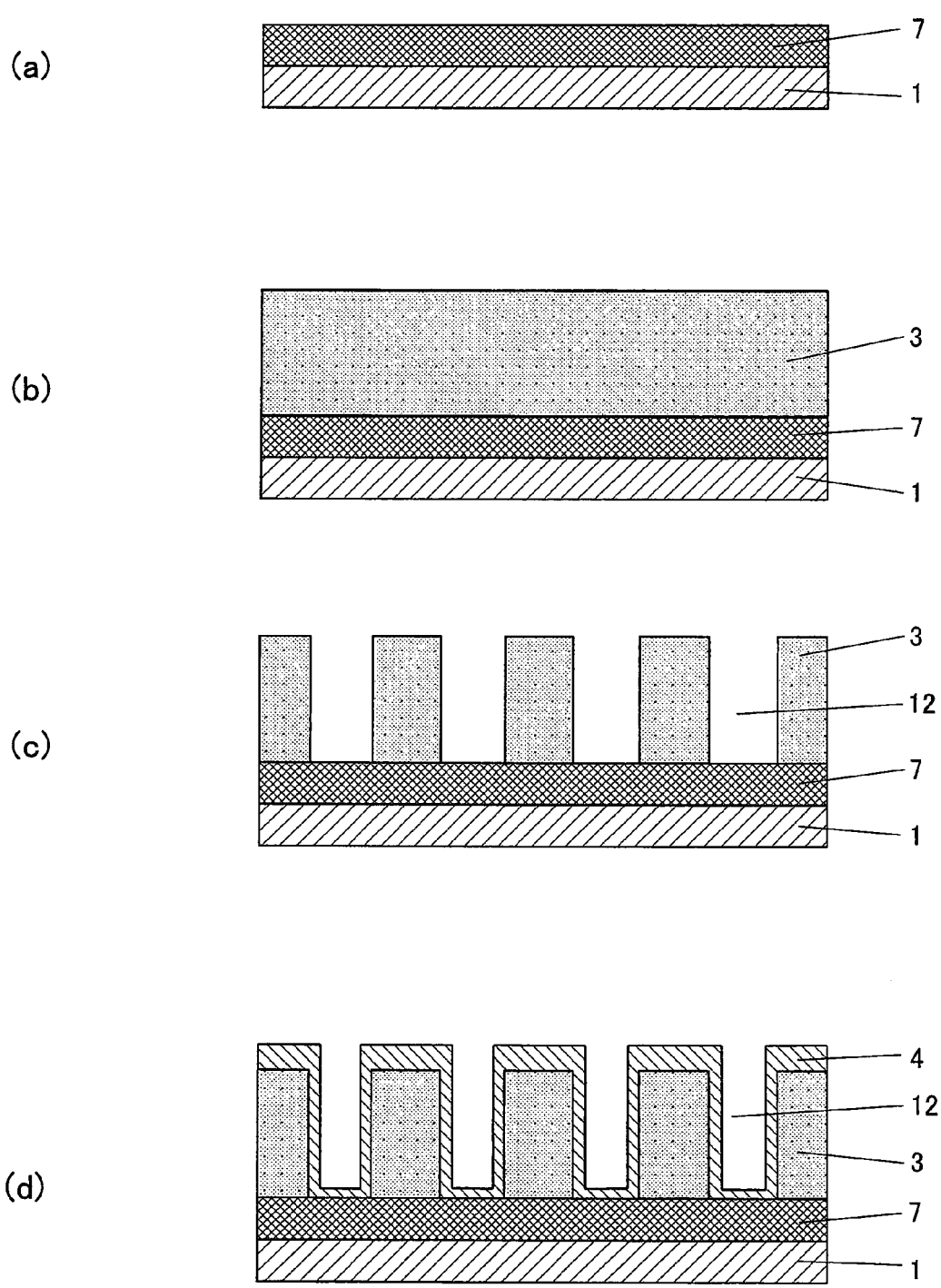
FIG. 16A is diagrams each showing a step in a second manufacturing method of the nonvolatile memory element according to the second embodiment of the invention, wherein FIG. 16A(a) is a sectional view showing the step of forming a first wire.

Next, a second manufacturing method for the nonvolatile memory element of the second embodiment will be described. FIGS. 16A(*a*) to 16A(*d*) and FIGS. 16B(*a*) to 16B(*d*) are sectional views each showing a step in the second manufacturing method of the nonvolatile memory element according to the second embodiment of the invention. The steps shown in FIGS. 16A(*a*) to 16A(*d*) are the same as of FIGS. 14A(*a*) to 14A(*d*) of the first embodiment and therefore an explanation thereof is omitted.

Figure 16B:
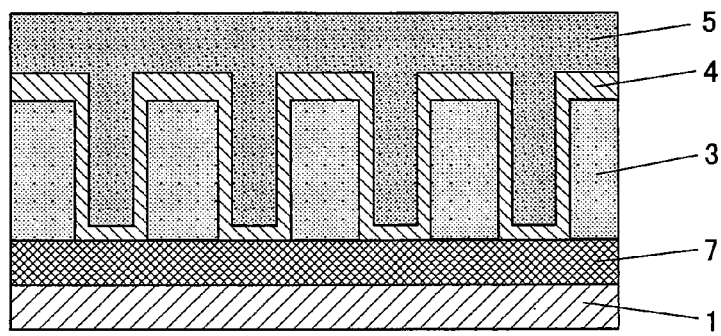
FIG. 16B is diagrams each showing a step in the second manufacturing method of the nonvolatile memory element according to the second embodiment of the invention, wherein FIG. 16B(a) is a sectional view showing the step of forming an embedded insulating film.
Figure 16B:
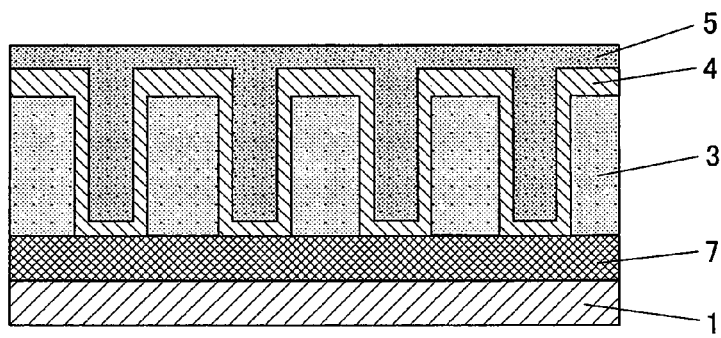
Figure 16B:
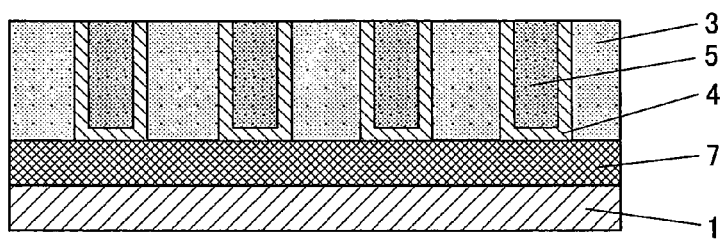
Figure 16B:
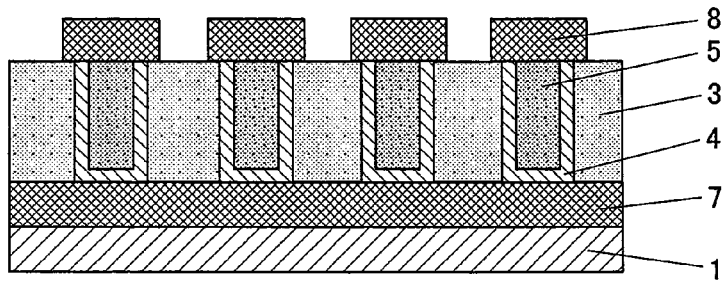

In the step shown in FIG. 16B(*a*), the embedded insulating film 5 composed of an F (fluorine)-doped oxide film is deposited by a CVD process or the like so as to have a thickness of 400 nm. Since the diameter of the contact holes is 250 nm, the contact holes are filled with the embedded insulating film 5 by depositing the 400 nm-thick embedded insulating film 5 in this way.

In this case, the embedded insulating film grows from the inner wall faces (where the variable resistance film 4 is formed) of the contact holes and the interior regions of the contact holes defined by the variable resistance film 4 are filled with the embedded insulating film 5.

Figure 17A:
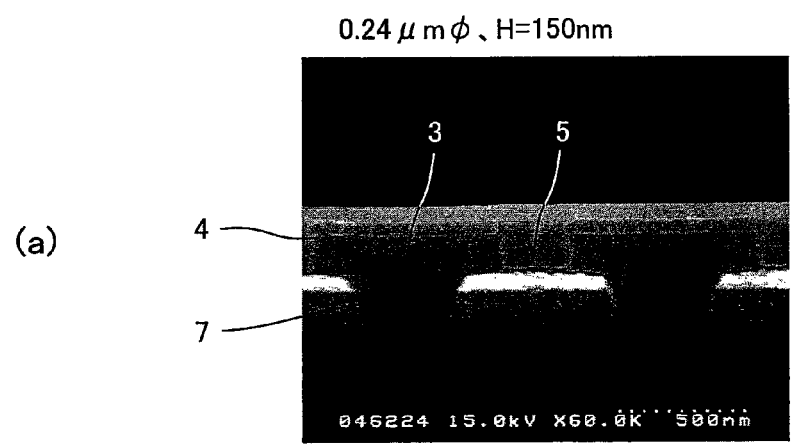
FIG. 17A is sectional views of a major part of the nonvolatile memory element formed through the steps shown in FIG. 16B, wherein FIGS. 17A(a) to 17A(c) show contact holes which have a height of 150 nm and diameters of 0.24 μm, 0.40 μm and 0.60 μm, respectively.
Figure 17A:
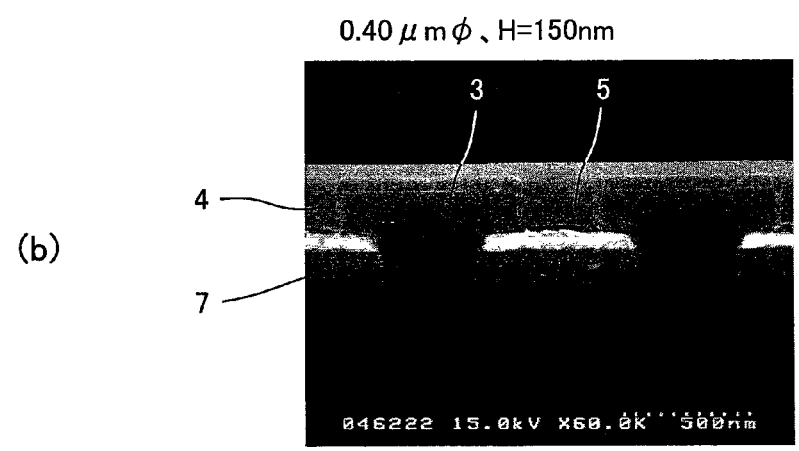
Figure 17A:
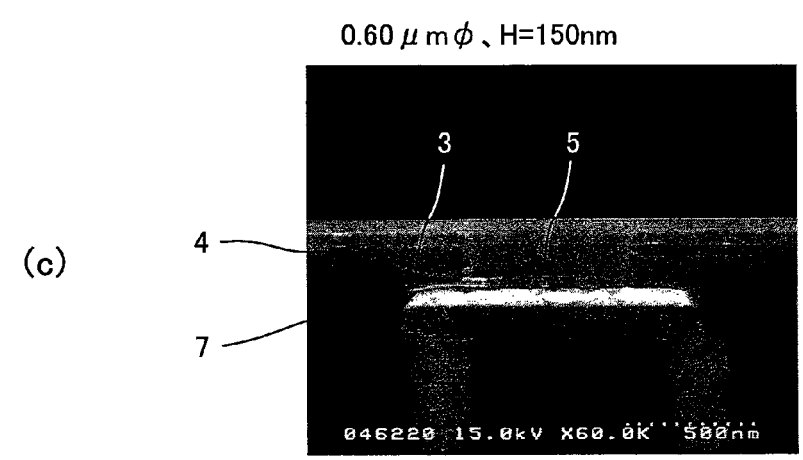
Figure 17B:
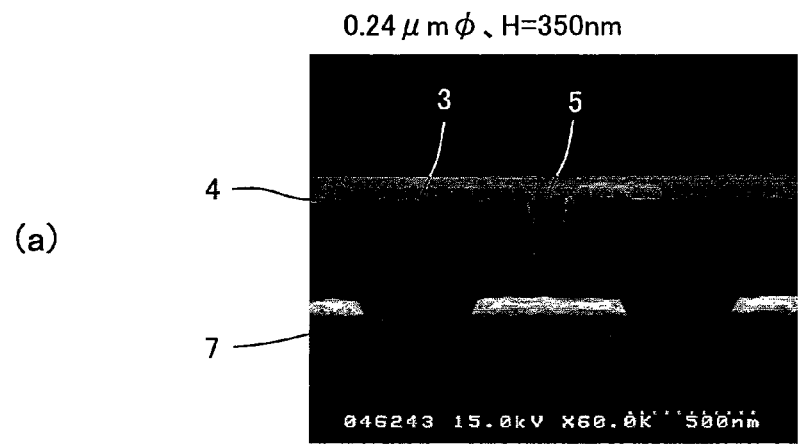
FIG. 17B is sectional views of a major part of the nonvolatile memory element formed through the steps shown in FIG. 16B, wherein FIGS. 17B(a) to 17B(c) show contact holes which have a height of 350 nm and diameters of 0.24 μm, 0.40 μm and 0.60 μm, respectively.
Figure 17B:
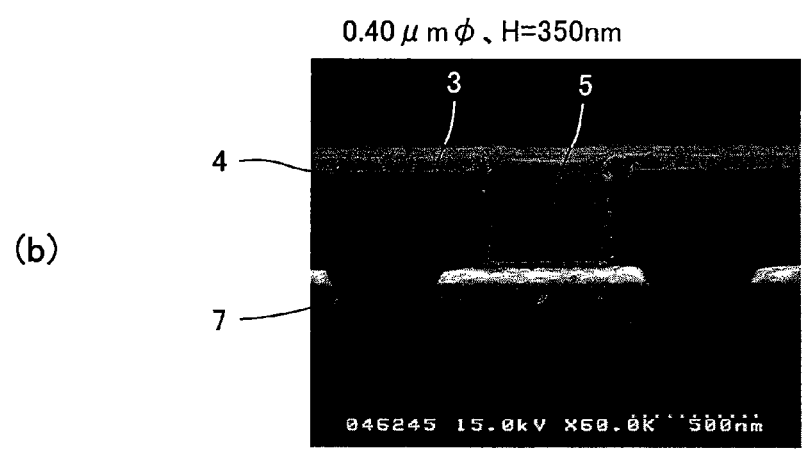
Figure 17B:
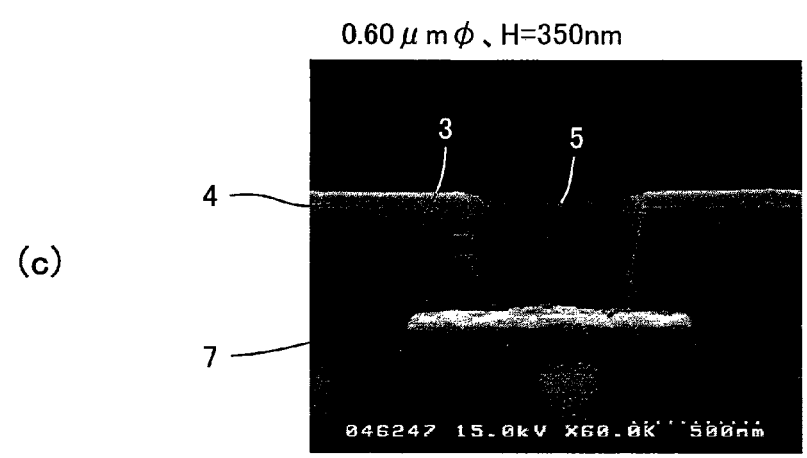

Then in the step shown in FIG. 16B(*b*), the embedded insulating film 5 is polished by CMP for planarization. The sectional views of a major part of the nonvolatile memory element in this step are shown in FIGS. 17A, 17B. The contact holes shown in FIGS. 17A(*a*) to 17A(*c*) have a height H of 150 nm and diameters of 0.24 μm, 0.40 μm and 0.60 μm, respectively. The contact holes shown in FIGS. 17B(*a*) to 17B(*c*) have a height H of 350 nm and diameters of 0.24 μm, 0.40 μm and 0.60 μm, respectively. In these figures, a variable resistance film made of $Fe_3O_4$ and having a thickness of 50 nm is deposited.

By reference to FIGS. 17A(*a*) to 17A(*c*) and FIGS. 17B(*a*) to 17B(*c*), it can be confirmed that the contact holes of these figures having different diameters and heights are all filled with the embedded insulating film 5 and the embedded insulating film 5 remains on the top of the variable resistance film 4.

Figure 18:
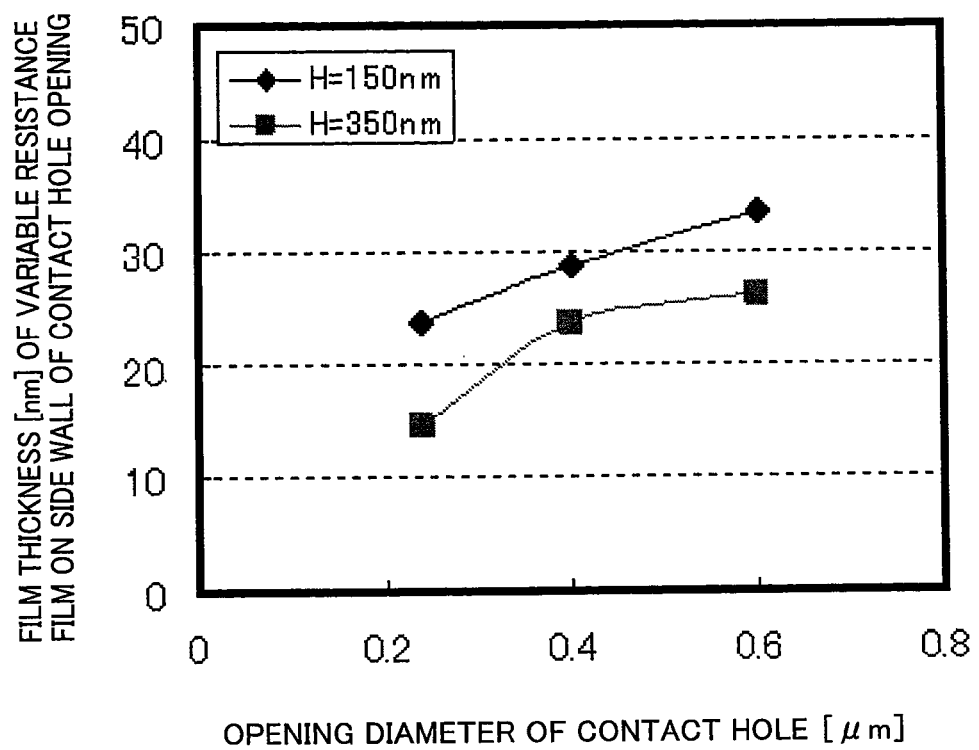
FIG. 18 is a graph showing the relationship between the opening diameter of a contact hole and the film thickness of a variable resistance film formed in the inner wall face of the contact hole.

FIG. 18 shows the relationship between the opening diameter of a contact hole and the film thickness of the variable resistance film formed in the inner wall face of the contact hole. Since the variable resistance film is formed by sputtering, the variable resistance film formed on the inner wall face of the contact hole is thinner with the smaller opening and greater height of the contact hole. That is, the film thickness of the variable resistance film formed on the inner wall face of the contact hole can be controlled by properly setting the opening diameter and height of the contact hole to attain effective miniaturized electrodes.

Then in the step shown in FIG. 16B(*c*), the exposed surface is entirely etched back to expose the interlayer dielectric film 3 whereby the embedded insulating film 5 is left within the contact holes. In this case, the variable resistance film 4 is directly covered with the interlayer dielectric film 5 after the formation of the variable resistance film 4 on the inner wall faces and bottom faces of the contact holes, and therefore the variable resistance film 4 is not etched in an exposed condition. Since the variable resistance film 4 on the inner wall faces of the contact holes is thus covered with the interlayer dielectric film 5, even if using the etch back process, a reduction in film thickness caused by etching, degradation of the film due to plasma damage and reduction due to exposure to a reduction atmosphere can be suppressed without fail.

Figure 19:
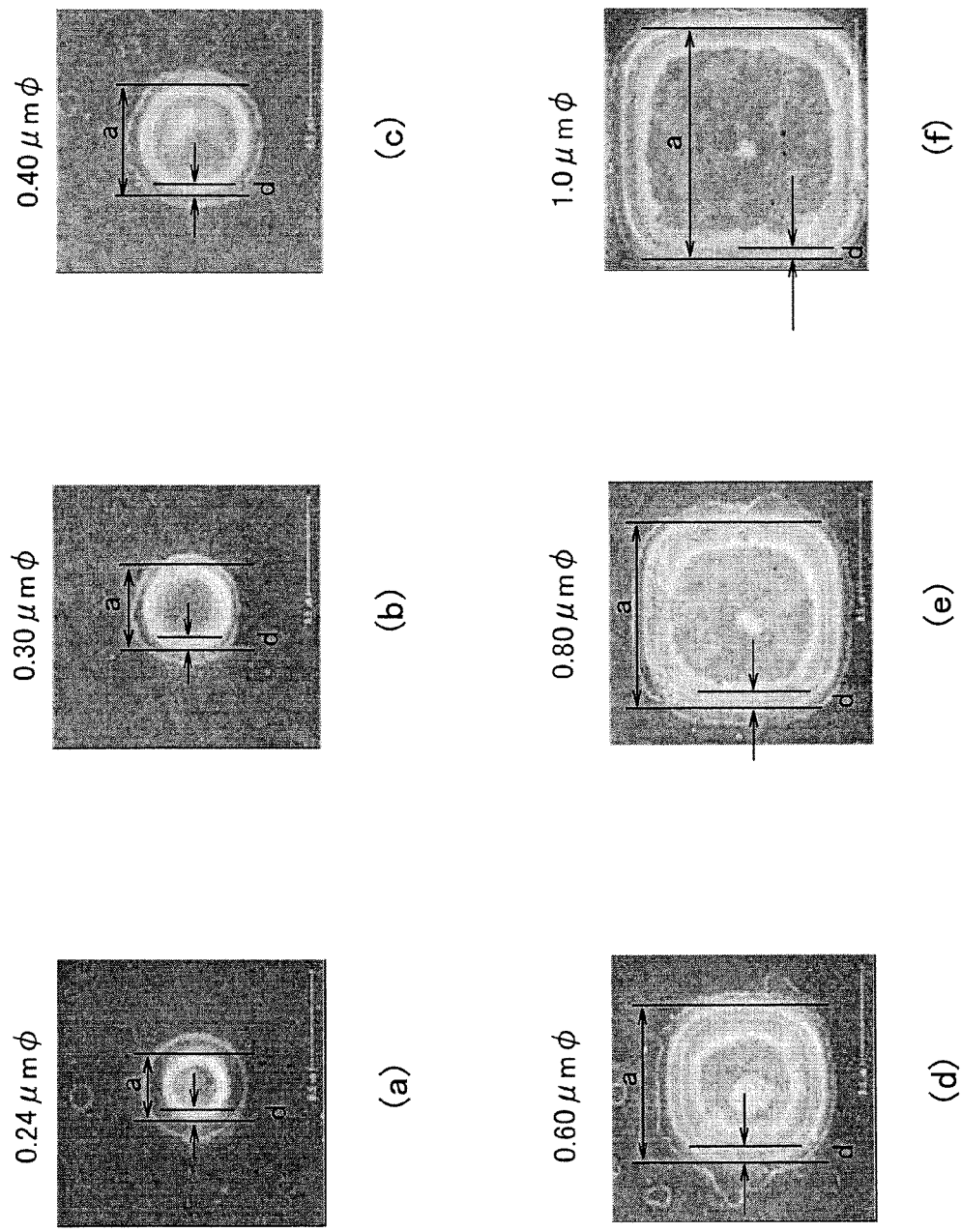
FIGS. 19(a) to 19(f) are plan views each showing the configuration of the nonvolatile memory element in the step shown in FIG. 16B(c).
Figure 20:
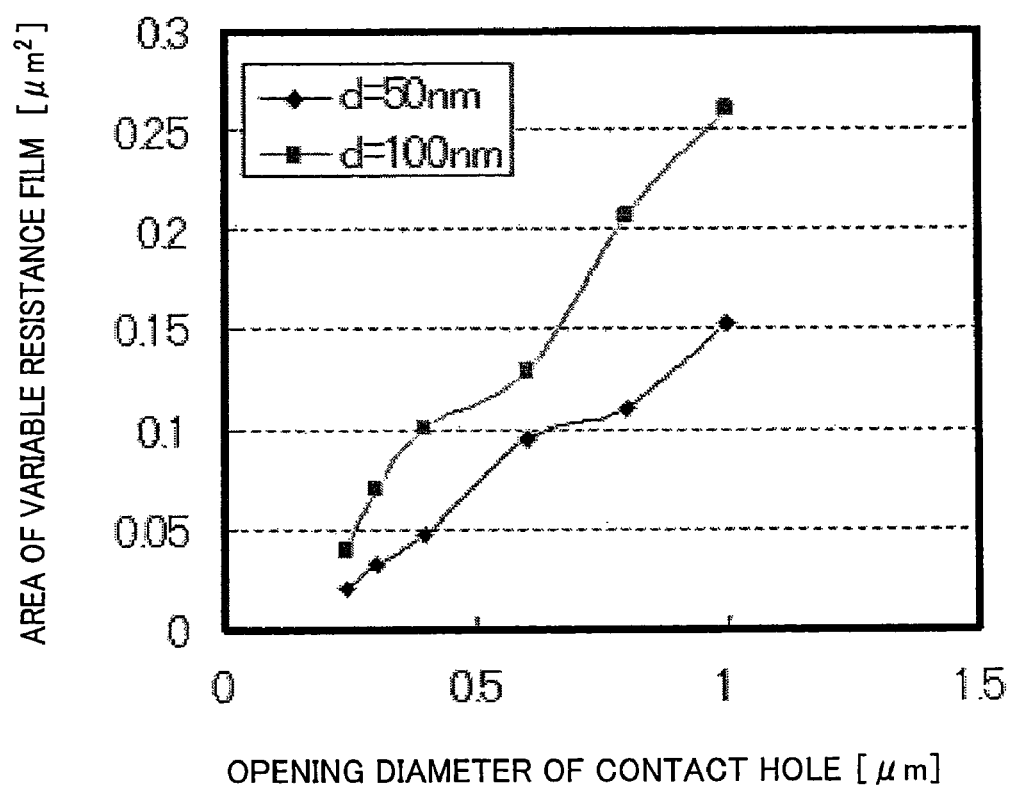
FIG. 20 is a graph showing the relationship between the opening diameter of the contact hole and the area of the variable resistance film formed in the inner wall face of the contact hole.
Figure 21:
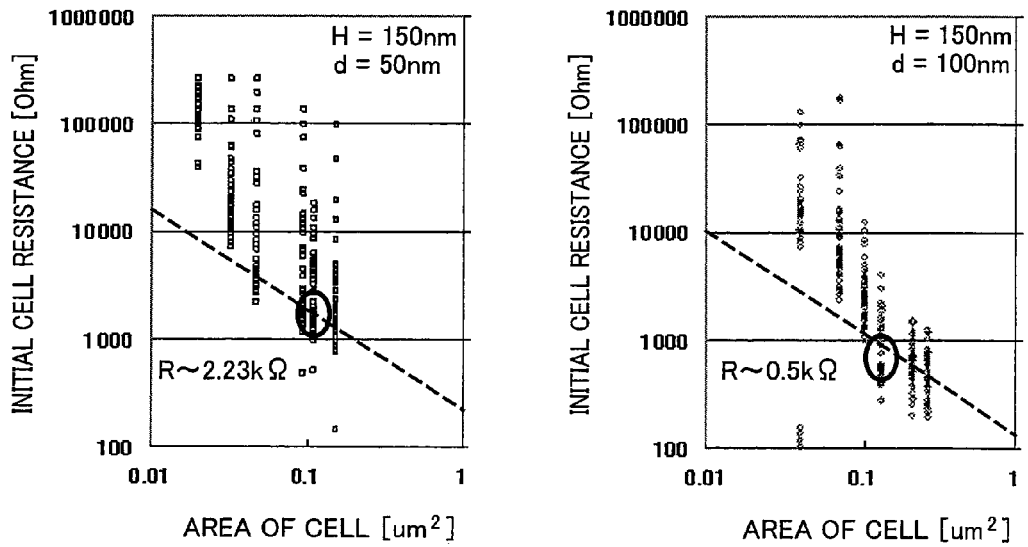
FIGS. 21(a) to 21(d) are graphs showing the initial cell resistance of the nonvolatile memory element according to the second embodiment.
Figure 21:
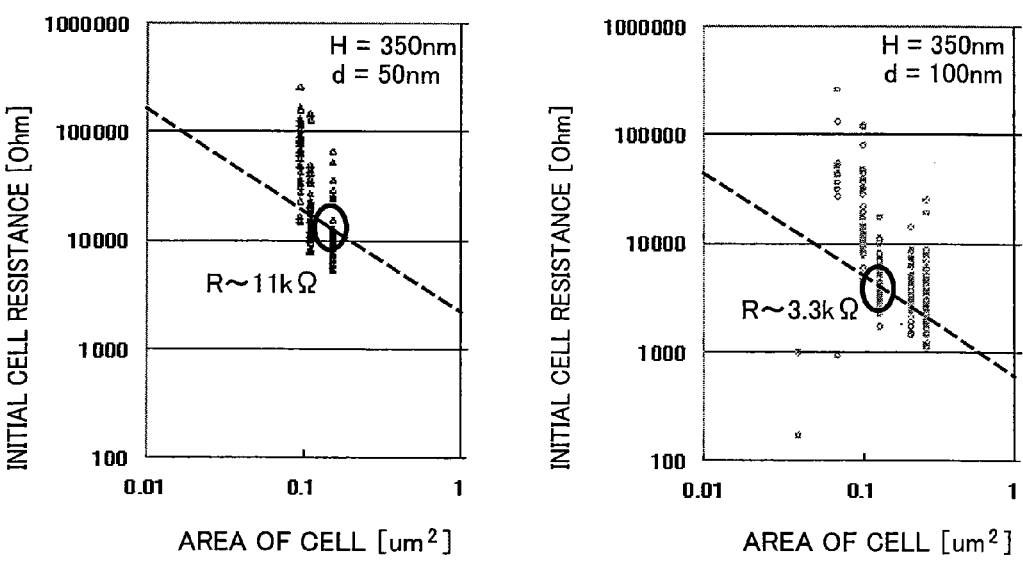

FIGS. 19(*a*) to 19(*f*) are plan views each showing the configuration of the nonvolatile memory element in the step shown in FIG. 16B(*c*). The film thickness d of the variable resistance film formed on the inner wall face of a contact hole when the contact hole has a diameter a of 0.24 μm, 0.30 μm, 0.40 μm, 0.60 μm, 0.80 μm or 1.0 μm can be checked by FIGS. 19(*a*) to 19(*f*). The relationship between the opening diameter of the contact hole and the area of the variable resistance film on the inner wall face of the contact hole is shown in FIG. 20. It is understood that the area of the variable resistance film can be controlled by changing the film thickness d of the variable resistance film (the cases where the film thickness is 50 nm and 100 nm are shown in the drawing).

FIGS. 19(*a*) to 19(*f*) show the diameter (indicated by a) of the contact holes and the film thickness (indicated by d) of the variable resistance film for illustrative purposes and they are not necessarily precise in the strict sense.

The embedded insulating film 5 and the variable resistance film 4 may be polished, using CMP continuously in the steps shown in FIGS. 16B(*c*) to 16B(*d*). In this case, processing can be continuously performed so that the number of steps can be reduced compared to the case where etch back is used. In addition, since the embedded insulating film 5 and the variable resistance film 4 are polished in this order, the end point detection can be used, in which completion of the polishing is detected from a change in the pressure imposed on the polishing pad caused by a transition of polishing from the embedded insulating film 5 to the variable resistance film 4. This leads to a more reliable control. Additionally, since the contact holes are filled with the embedded insulating film 5, the polishing slurry will not remain within the contact holes.

Finally, as shown in FIG. 16B(d), a plurality of second wires 8, composed of a close contact layer TaN and a main portion Cu material (Cu/TaN=180 nm/20 nm) which are stacked in this order, are formed so as to extend in a specified direction. These wires 8 have a width of 300 nm and thickness of 200 nm. The second wires 8 are formed so as to close the top of the contact holes and so as to intersect the first wires 7.

(Cell Resistance)

The initial cell resistance of the nonvolatile memory element fabricated through the above process is shown in FIGS. 21(a) to 21(d). These figures show the cases where the film thickness of the variable resistance film is selected from 50 nm and 100 nm and the height of the contact holes is selected from 150 nm and 350 nm in combination. The cell area of variable resistance film is plotted as the abscissa whereas the initial cell resistance is plotted as the ordinate. Since the manufacturing method is not optimized, the variation in the resistance is significant. However, the cell resistance satisfies the following relationships and it is therefore ascertained that the cell resistance is adjustable in this embodiment.

(H=350 nm, d=50 nm)>(H=350 nm, d=100 nm)
(H=150 nm, d=50 nm)>(H=150 nm, d=100 nm)
(H=350 nm, d=50 nm)>(H=150 nm, d=50 nm)
(H=350 nm, d=100 nm)>(H=350 nm, d=100 nm)

Figure 22:
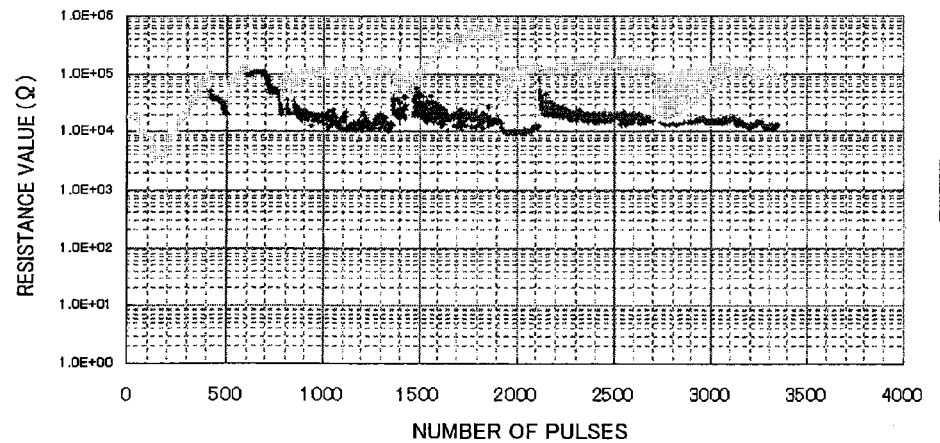
FIGS. 22a to 22(c) are graphs showing changes in the resistance of the cells of the nonvolatile memory element according to the second embodiment.
Figure 22:
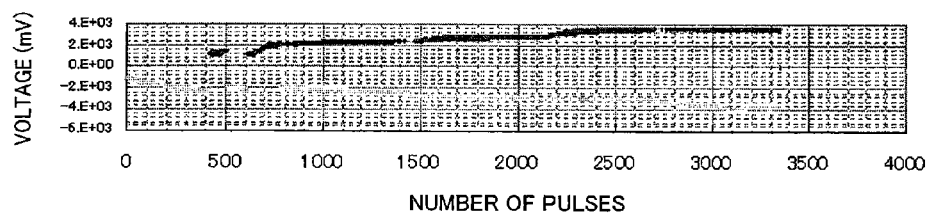
Figure 22:
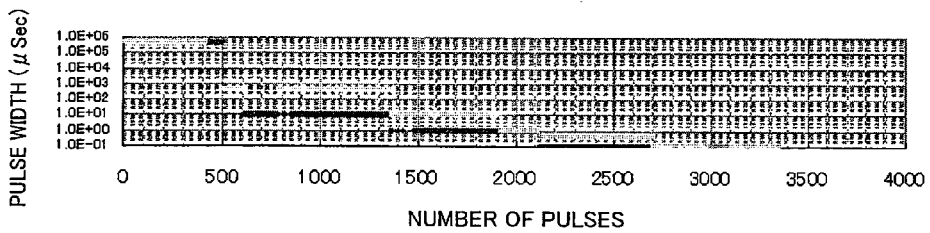

How the cell resistance varies in this embodiment is shown in FIGS. 22(a) to 22(c). In the graphs of FIGS. 22(a) to 22(c), the abscissa indicates the number of pulses applied to the cell. The ordinates in FIGS. 22(a), 22(b), 22(c) indicate the resistance value of the cell, the voltage of the cell and pulse width, respectively. As the number of applied pulses increases, the pulse width required for a change in the cell resistance decreases. In these figures, the resistance change behavior can be seen in a width of 100 ns at a minimum.

Third Embodiment

Configuration of Nonvolatile Memory Element

Figure 3:
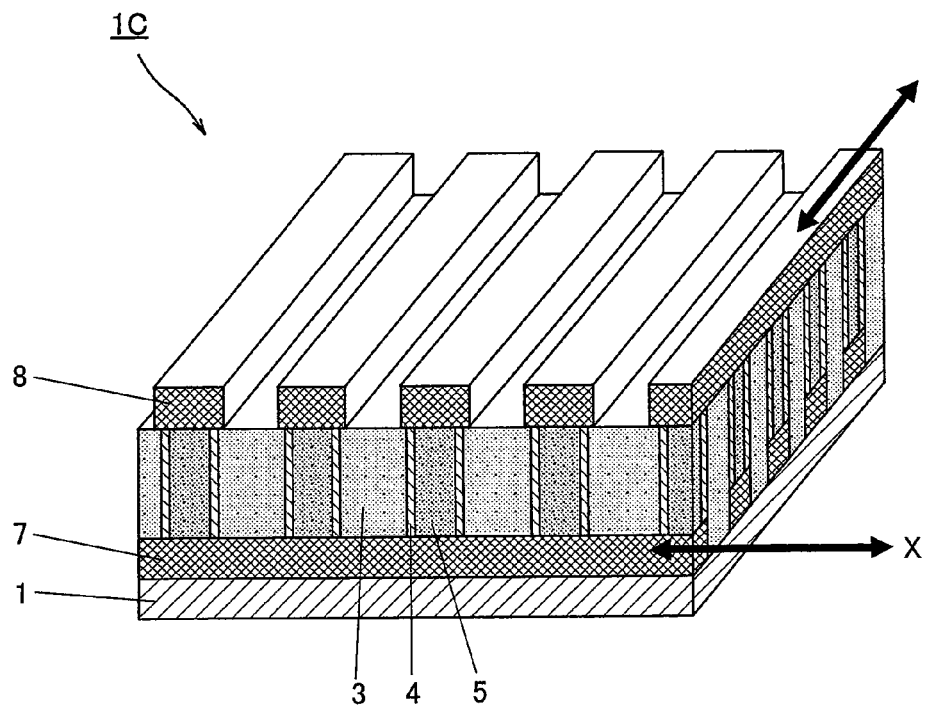
FIG. 3 is a sectional perspective view showing the configuration of a nonvolatile memory element according to a third embodiment of the invention.

FIG. 3 is a sectional perspective view showing the configuration of a nonvolatile memory element according to a third embodiment of the invention. As illustrated in FIG. 3, the nonvolatile memory element 1C of the third embodiment has a plurality of first wires 7 (Cu/TaN) arranged in a stripe pattern on the substrate 1 so as to extend in an X direction. The interlayer dielectric film 3 (SiO$_2$, having a film thickness of 500 nm) is formed on the first wires 7. A plurality of second wires 8 (Cu/TaN) are arranged in a stripe pattern on the interlayer dielectric film 3 so as to extend in a Y direction that intersects the extending direction X of the first wires. The interlayer dielectric film 3 is provided with contact holes each located at a position where first wires 7 and second wires 8 intersect each other. Each contact hole is provided on an inner wall face thereof with a variable resistance film 4 (Fe$_3$O$_4$, having a film thickness of 10 nm). Further, an embedded insulating film 5 (SiO$_2$) is filled within each contact hole provided with the variable resistance film 4.

That is, as illustrated in FIG. 3, the nonvolatile memory element 1C of the third embodiment is formed as follows: The plurality of first wires 7 each having an elongated rectangular shape (i.e., the shape of a strip having a specified width and length) are formed on the substrate 1 such that they extend in parallel with one another within a first plane (not shown) that is parallel to the main surface of the substrate. Formed on the substrate 1 are the plurality of electrode wires 8 of the same shape which extend in parallel with one another within a second plane (not shown) that is located above and substantially parallel to the first plane. Therefore, the plurality of first electrode wires 7 and the plurality of second electrode wires 8 bisect at right angles in a plan view (specifically, the first and second electrode wires 7 and 8 spatially intersect each other at right angles).

In each region where first and second wires 7, 8 intersect each other, the variable resistance film 4 is sandwiched between the first wire 7 serving as a first electrode and the second wire 8 serving as a second electrode. The variable resistance film 4 thus sandwiched functions as a storage section. That is, a memory cell is formed at each of the spatial intersection points of the first wires 7 and the second wires 8. With the configuration described above, a cross point type large-capacity nonvolatile memory element can be achieved.

According to the third embodiment, in each intersection region where first and second wires 7, 8 intersect each other, the first wire 7 constitutes a first electrode whereas the second wire 8 constitutes a second electrode. Therefore, other first and second electrodes than the first and second wires 7, 8 are not provided. However, unless other first and second electrodes are provided, chemical reactions, peeling, degradation of the resistance change characteristic sometimes occur depending on selection of the material of the variable resistance film and the wires. In this case, first and second electrodes may be disposed between the variable resistance film and the first and second wires, respectively.

Fourth Embodiment

Configuration of Nonvolatile Memory Element

Figure 4:
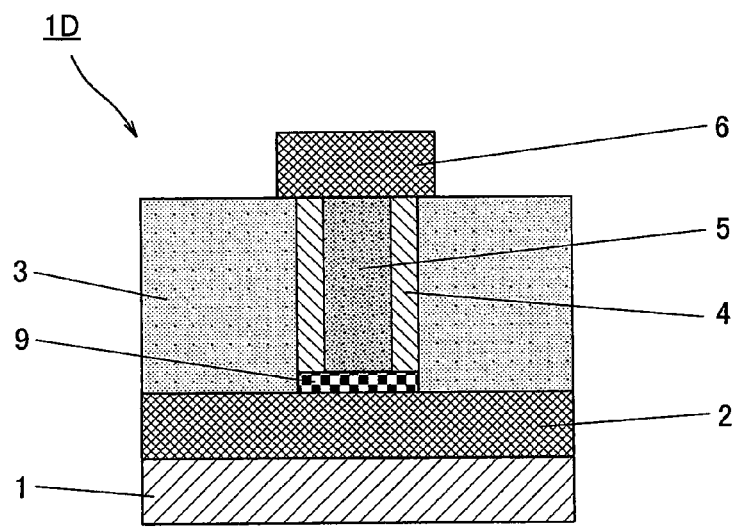
FIG. 4 is a sectional view showing the configuration of a nonvolatile memory element according to a fourth embodiment of the invention.

FIG. 4 is a sectional view showing the configuration of a nonvolatile memory element according to a fourth embodiment of the invention. As illustrated in FIG. 4, the nonvolatile memory element 1D of the fourth embodiment has a first electrode 2 (Cu/TaN) formed on the substrate 1 and an interlayer dielectric film 3 (SiO$_2$, having a film thickness of 500 nm) formed on the first electrode 2. Contact holes (having a diameter of 250 nm) pierce through the interlayer dielectric film 3. A diode material 9 having a rectifying characteristic is disposed at the bottom face of each contact hole. The contact hole positioned on the diode material 9 is provided on an inner wall face thereof with a variable resistance film 4 (Fe$_3$O$_4$, having a film thickness of 10 nm). In addition, an embedded insulating film 5 (SiO$_2$) is filled within the contact hole provided with the variable resistance film 4. Further, a second electrode 6 (Cu/TaN) is disposed on the variable resistance film 4.

The fourth embodiment differs from the first embodiment in that the fourth embodiment has the diode material 9 located just under the variable resistance film 4. Even in the case of a cross-point configuration in which a plurality of memory cells are formed by arranging the nonvolatile memory element 1D of the fourth embodiment in a matrix pattern, a flow of sneak current into adjacent cells which often occurs during read-out and write-in can be prevented because of the diode formed in each cell.

Fifth Embodiment

Configuration of Nonvolatile Memory Element

Figure 5:
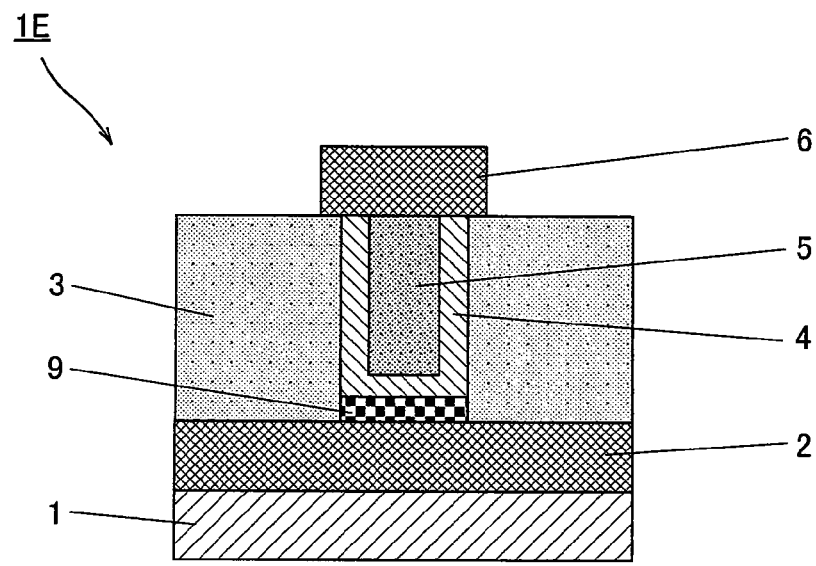
FIG. 5 is a sectional view showing the configuration of a nonvolatile memory element according to a fifth embodiment of the invention.

FIG. 5 is a sectional view showing the configuration of a nonvolatile memory element according to a fifth embodiment of the invention. As illustrated in FIG. 5, the nonvolatile memory element 1E of the fifth embodiment has a first electrode 2 (Cu/TaN) formed on the substrate 1 and an interlayer dielectric film 3 (SiO$_2$, having a film thickness of 500 nm) formed on the first electrode 2. Contact holes (having a diameter of 250 nm) pierce through the interlayer dielectric film 3. A diode material 9 having a rectifying characteristic is disposed at the bottom face of each contact hole. The contact hole on the diode material 9 is provided on an inner wall face and a bottom face thereof with a variable resistance film 4 (Fe$_3$O$_4$, having a film thickness of 10 nm). In addition, an embedded insulating film 5 (SiO$_2$) is filled within the contact hole. Further, a second electrode 6 (Cu/TaN) is disposed on the variable resistance film 4.

The fifth embodiment differs from the fourth embodiment in that the variable resistance film 4 and the diode material 9 contact each other over the entire sectional surface of the contact hole in the fifth embodiment. With this configuration, the current flowing in the diode material 9 flows over the entire sectional surface of the contact hole so that the driving current required for operation of the resistance change memory can be sufficiently obtained.

(Manufacturing Method of Nonvolatile Memory Element)

Next, a manufacturing method for the nonvolatile memory element of the fifth embodiment of the above configuration will be explained.

Figure 23A:
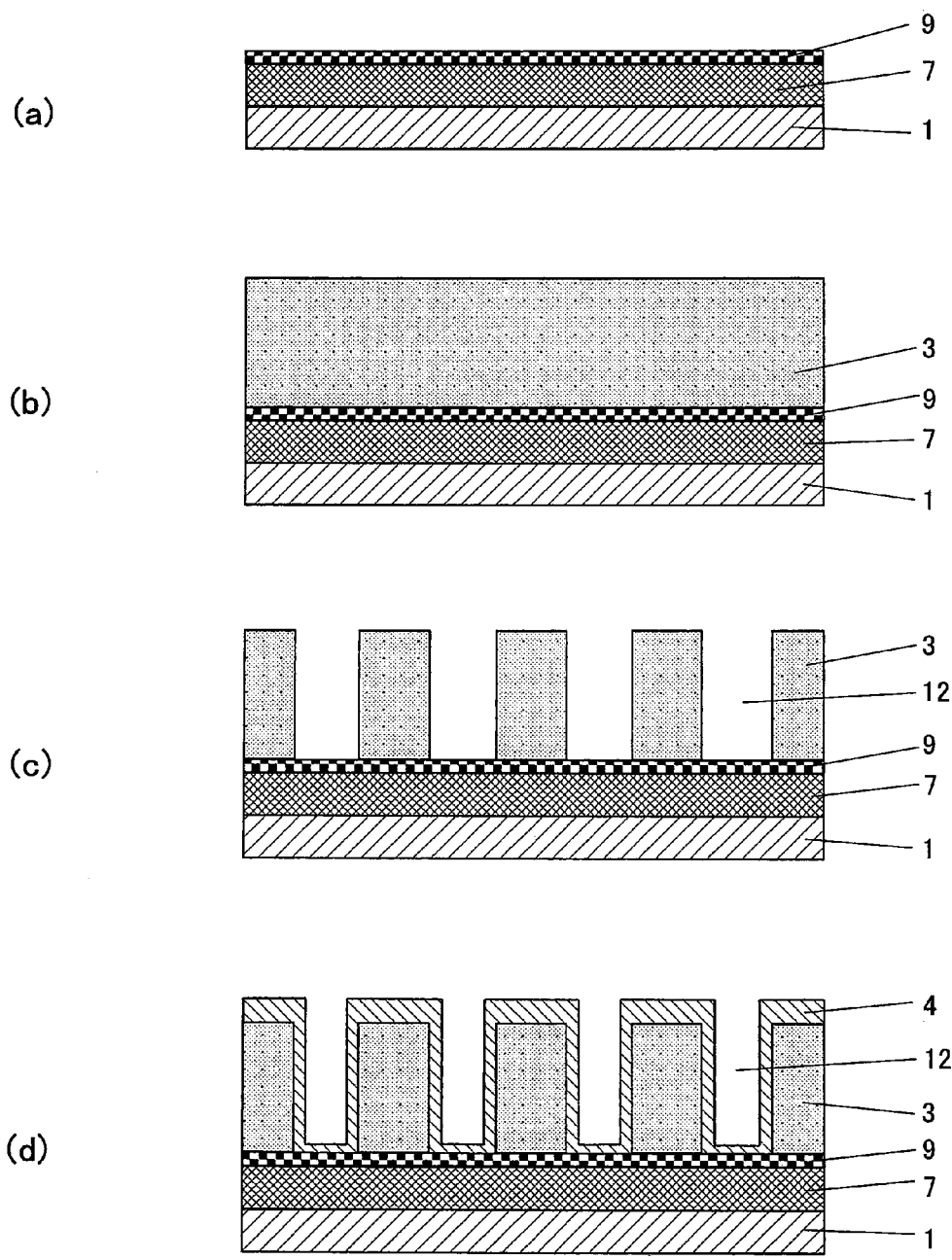
FIG. 23A is diagrams each showing a step in a manufacturing method of the nonvolatile memory element according to the fifth embodiment of the invention, wherein FIG. 23A(a) is a sectional view showing the step of forming a first wire and a diode material.
Figure 23B:
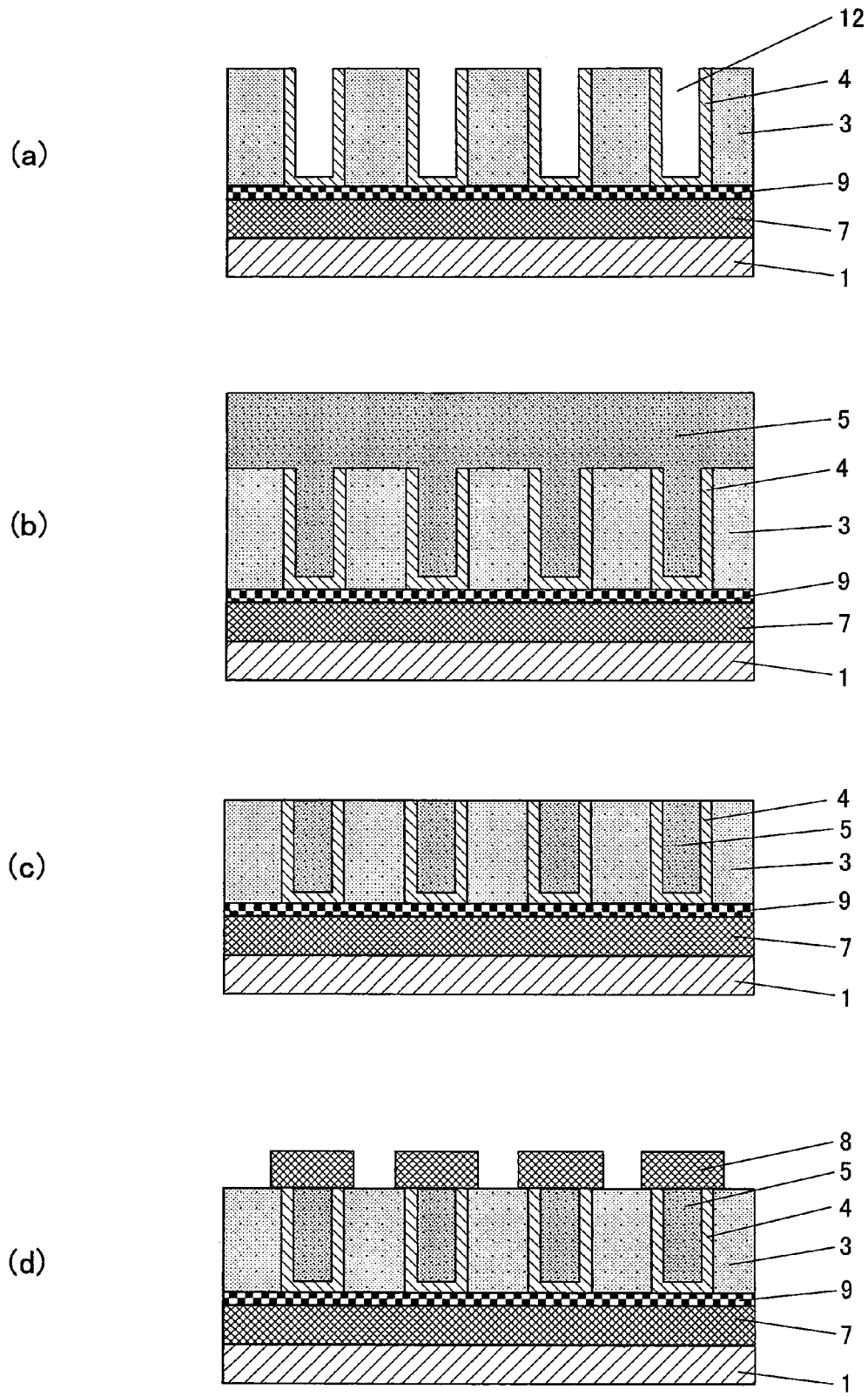
FIG. 23B is diagrams each showing a step in the manufacturing method of the nonvolatile memory element according to the fifth embodiment of the invention, wherein FIG. 23B(a) is a sectional view showing the step of polishing the variable resistance film.

FIGS. 23A(a) to 23A(d) and FIGS. 23B(a) to 23B(d) are sectional views each showing a step in the manufacturing method of the nonvolatile memory element according to the fifth embodiment of the invention.

In the step shown in FIG. 23A(a), a first wire 7 (Cu/TaN), composed of a close contact layer TaN and a main portion Cu material which are stacked in this order, is formed on the substrate 1. A diode material 9 is formed on the first wire 7. A plurality of stack structures each composed of the first wire 7 and the diode material 9 are formed so as to extend in a specified direction and so as to have a width of 300 nm and thickness of 250 nm (Diode/Cu/TaN=50 nm/180 nm/20 nm). The first wire (Cu/TaN) 7 may be formed by the damascene process according to which after a groove for the wire to be embedded is formed in the interlayer dielectric film 3, a TaN film and a Cu film are formed by sputtering and plating respectively and then embedded by CMP. The diode material 9 may be embedded within the groove together with the wire. The stack structures each composed of three layers, i.e., the first wire 7, the diode material 9 and the interlayer dielectric film 3 may be subjected to etching and patterning.

Next, in the step shown in FIG. 23A(b), an F(fluorine)-doped oxide film is deposited by a CVD process or the like and then, a 550 nm-thick interlayer dielectric film 3 is formed by CMP.

Next, in the step shown in FIG. 23A(c), cylindrical contact holes 12 having a diameter of 250 nm are formed by dry etching so as to piece through the interlayer 3 to the diode material 9.

Next, in the step shown in FIG. 23A(d), a variable resistance film 4 made of a transition metal oxide film material such as FeO$_x$ is formed on the exposed faces of the interlayer dielectric film 3 and the first wires 7 by sputtering.

Next, in the step shown in FIG. 23B(a), the variable resistance film 4 is polished with CMP to thereby remove the variable resistance film 4 formed on the top of the interlayer dielectric film 3. Unlike the second manufacturing method of the second embodiment that has been described with reference to FIG. 16B, the film to be polished is a single film layer in the fifth embodiment, so that reliable polishing can be carried out while preventing scratching by use of a slurry suited for the variable resistance film.

Next, in the step shown in FIG. 23B(b), the embedded insulating film 5 consisting of an F(fluorine)-doped oxide film is deposited by a CVD process or the like so as to have a thickness of 400 nm. Since the diameter of the contact holes is 250 nm, the contact holes 12 are filled with the embedded insulating film 5 by depositing the 400 nm-thick embedded insulating film 5 in this way.

In this case, the embedded insulating film grows from the inner wall faces of the contact holes 12 so that the interior regions of the contact holes 12 are filled with the embedded insulating film 5.

Then, the embedded insulating film 5 is polished by CMP as shown in FIG. 23B(c) so as to leave the embedded insulating film 5 in the contact holes only. In this case, it is preferable to polish the underlaid interlayer dielectric film 5 by approximately 50 nm by CMP. The purpose of this is to expose the variable resistance film 4 formed on the inner wall faces of the contact holes without fail.

Finally, as shown in FIG. 23B(d), a plurality of second wires 8, composed of a close contact layer TaN and a main portion Cu material (Cu/TaN=180 nm/20 nm) which are stacked in this order, are formed so as to extend in a specified direction. The second wires 8 have a width of 300 nm and thickness of 200 nm. The second wires 8 are formed so as to close the top of the contact holes and so as to intersect the first wires 7.

Sixth Embodiment

Configuration of Nonvolatile Memory Element

Figure 6:
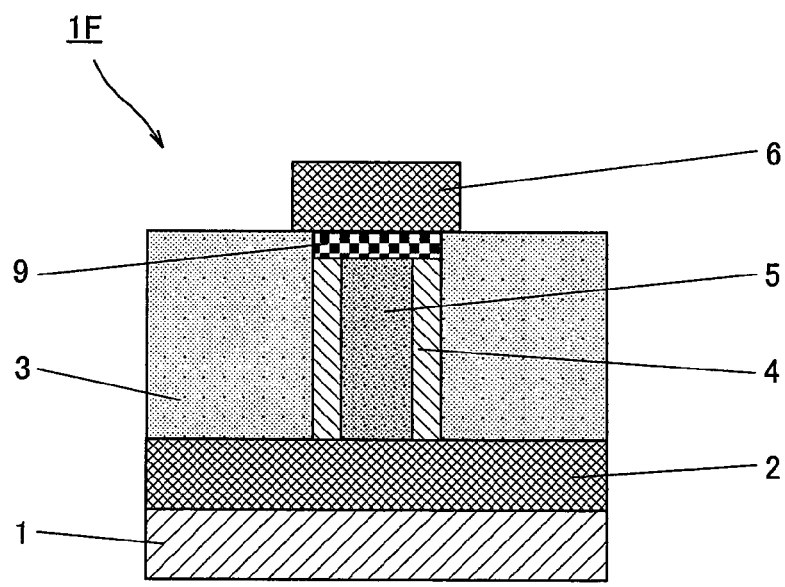
FIG. 6 is a sectional view showing the configuration of a nonvolatile memory element according to a sixth embodiment of the invention.

FIG. 6 is a sectional view showing the configuration of a nonvolatile memory element according to a sixth embodiment of the invention. As illustrated in FIG. 6, the nonvolatile memory element 1F of the sixth embodiment has a first electrode 2 (Cu/TaN) formed on the substrate 1 and an interlayer dielectric film 3 (SiO$_2$, having a film thickness of 500 nm) formed on the first electrode 2. Contact holes (having a diameter of 250 nm) pierce through the interlayer dielectric film 3. Each contact hole is provided on an inner wall face thereof with the variable resistance film 4 (Fe$_3$O$_4$, having a film thickness of 10 nm). In addition, an embedded insulating film 5 (SiO$_2$) is filled within the contact hole provided with the variable resistance film 4. Further, a diode material 9 having a rectifying characteristic is disposed on the top of the contact hole. Disposed on the diode material 9 is a second electrode 6 (Cu/TaN).

The sixth embodiment differs from the fourth embodiment in that the diode material 9 is disposed on the top of the contact hole in the sixth embodiment. This configuration has such an advantage in manufacturing method that utilizing the recesses, created owing to the different materials existing in a mixed condition in cases where the variable resistance film and the embedded insulating film are polished by CMP or the like, diode is formed in the recesses in a self-alignment manner.

(Manufacturing Method of Nonvolatile Memory Element)

Next, a manufacturing method for the nonvolatile memory element of the sixth embodiment of the above configuration will be explained.

Figure 24A:
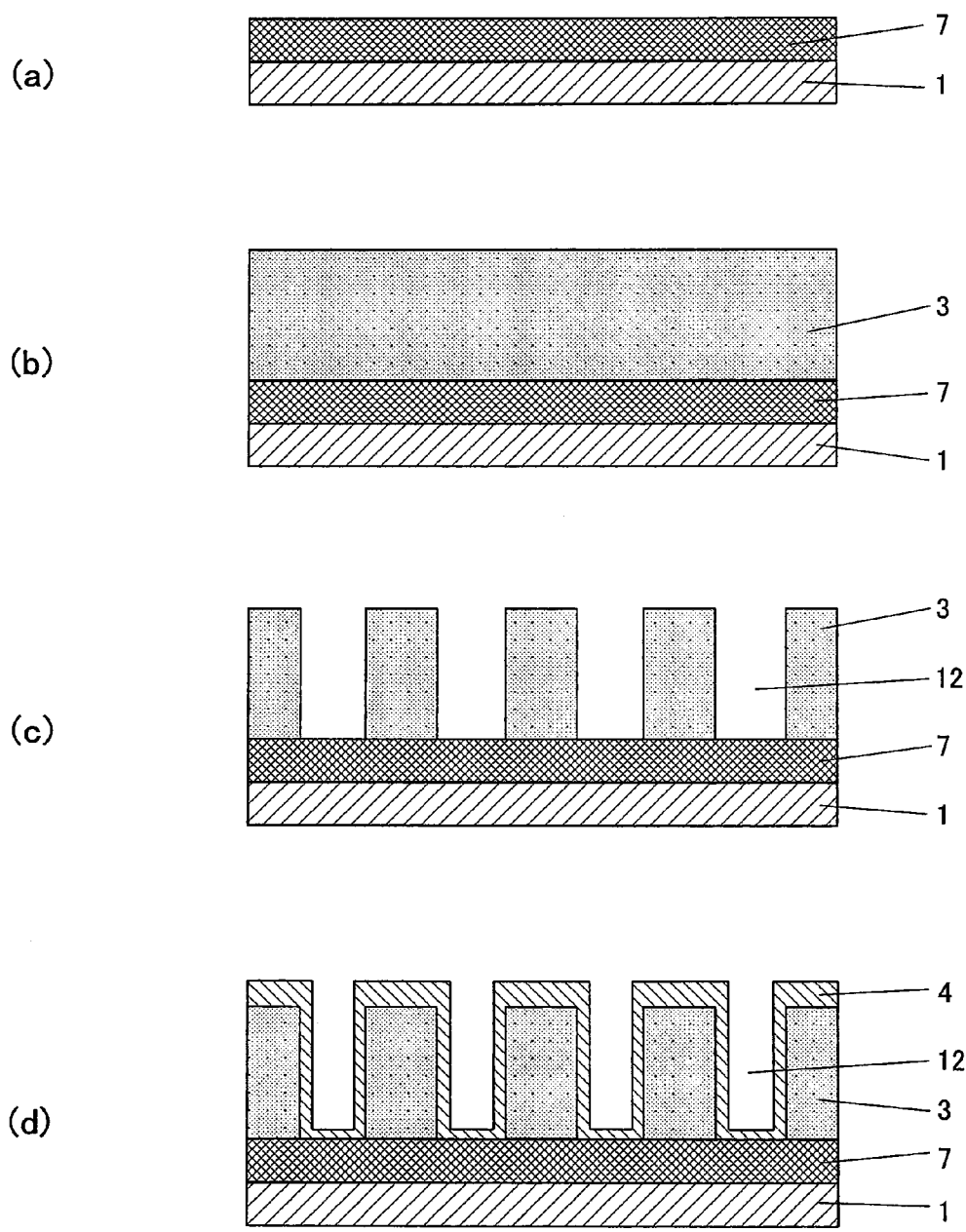
FIG. 24A is diagrams each showing a step in a manufacturing method of the nonvolatile memory element according to the sixth embodiment of the invention, wherein FIG. 24A(a) is a sectional view showing the step of forming a first wire.
Figure 24B:
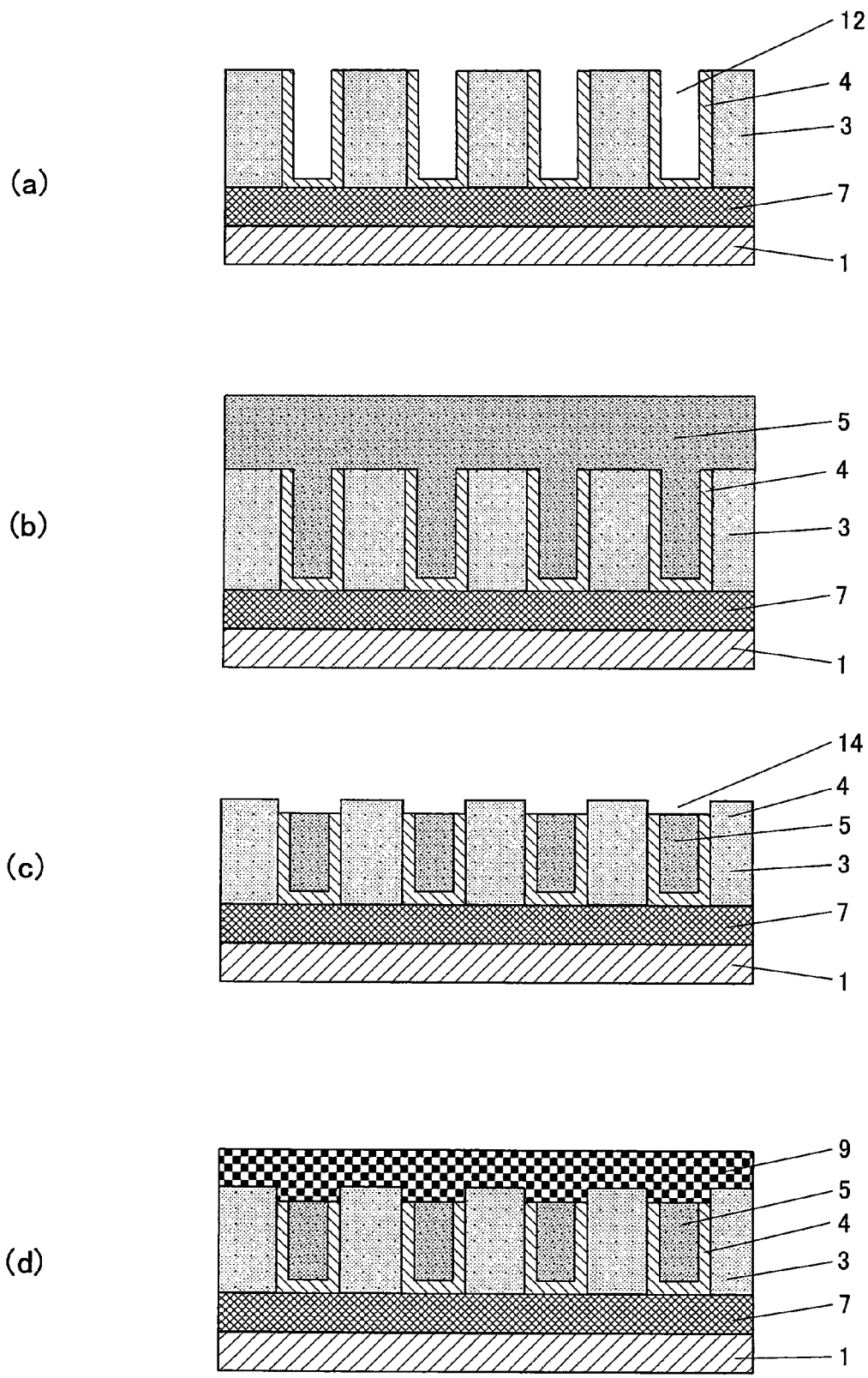
FIG. 24B is diagrams each showing a step in the manufacturing method of the nonvolatile memory element according to the sixth embodiment of the invention, wherein FIG. 24B(a) is a sectional view showing the step of removing the variable resistance film on the interlayer dielectric film.
Figure 24C:
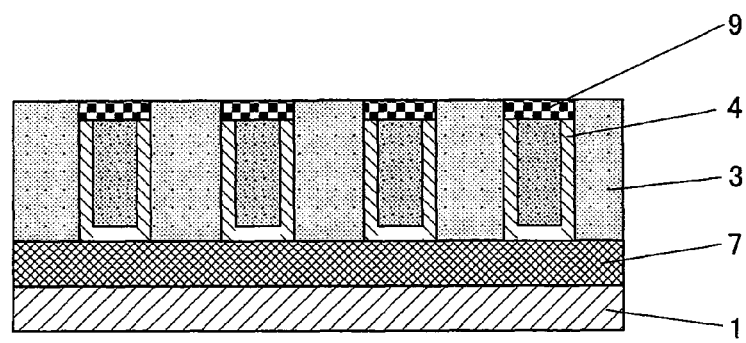
FIG. 24C is diagrams each showing a step in the manufacturing method of the nonvolatile memory element according to the sixth embodiment of the invention, wherein FIG. 24C(a) is a sectional view showing the step of polishing the diode material.
Figure 24C:
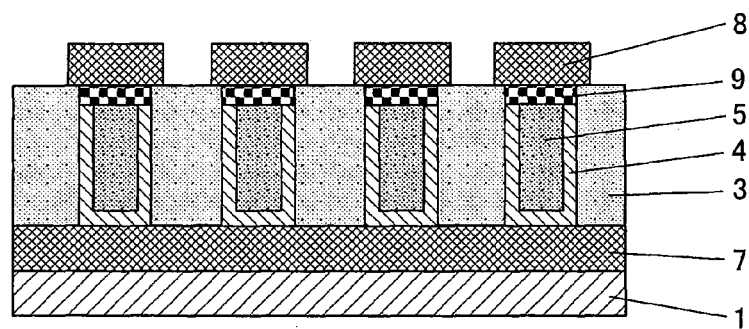

FIGS. 24A(a) to 24A(d), FIGS. 24B(a) to 24B(d) and FIGS. 24C(a) to 24C(d) are sectional views each showing a step in the manufacturing method of the nonvolatile memory element according to the sixth embodiment. The steps shown in FIGS. 24A(a) to 24A(d) and FIGS. 24B(a) to 24B(b) are the same as of FIGS. 15A(a) to 15A(d) and FIGS. 15B(a) to 15B(b) of the manufacturing method of the second embodiment described earlier and therefore an explanation thereof is omitted.

In the step shown in FIG. 24B(c), the embedded insulating film 5 is polished with CMP so as to leave the embedded insulating film 5 within the contact holes only. At that time, the polishing pressure of CMP is set high or otherwise polishing time is increased, thereby creating an approximately 50 nm-deep recess 14 in each contact hole. Although the recesses are formed by altering the conditions of CMP herein, the way of creation of the recesses is not limited to this. For example, after general CMP polishing, the recesses may be formed by performing etch back so as to etch only the variable resistance film 4 and the embedded insulating film 5. In this case, it is essential that the embedded insulating film 5 and the interlayer dielectric film 3 be constituted by different kinds of films. This is because, if these films 5, 3 are of the same kind, the interlayer dielectric film 3 will also be etched, and therefore, no recesses will be created during etch back.

Next, in the step shown in FIG. 24B(d), a diode material 9 is deposited so as to have a thickness of 100 nm. Since the depth of the recesses is 50 nm, the recesses of the contact holes are filled with the diode material 9 by the deposition of the diode material 9.

In the step shown in FIG. 24C(a), the diode material 9 is polished with CMP so as to leave the diode material 9 in the recesses of the contact holes only.

Finally, in the step shown in FIG. 24C(b), a plurality of second wires 8, composed of a close contact layer TaN and a main portion Cu material (Cu/TaN=180 nm/20 nm) which are stacked in this order, are formed so as to extend in a specified direction. The second wires 8 have a width of 300 nm and thickness of 200 nm. The second wires 8 are formed so as to close the top of the contact holes and so as to intersect the first wires 7.

In the sixth embodiment, the diode is formed within the contact holes in a self-alignment manner, which provides such an advantage in manufacturing process that the number of masks formed in the manufacturing method can be reduced.

Seventh Embodiment

Configuration of Nonvolatile Memory Element

Figure 7:
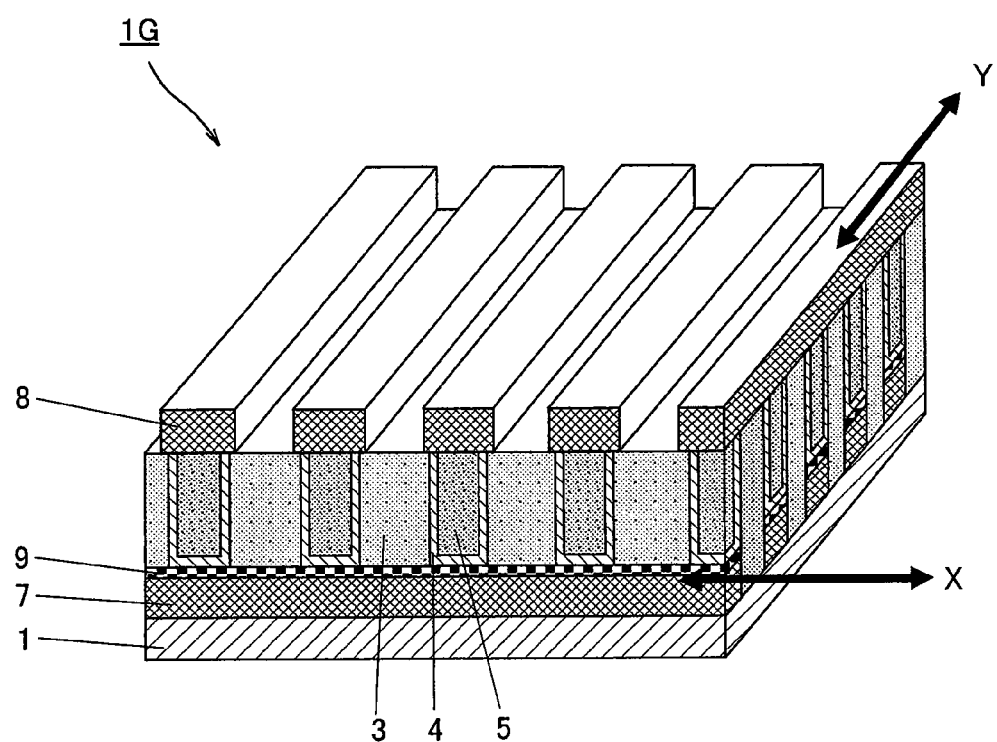
FIG. 7 is a sectional perspective view showing the configuration of a nonvolatile memory element according to a seventh embodiment of the invention.

FIG. 7 is a sectional perspective view showing the configuration of a nonvolatile memory element according to a seventh embodiment of the invention. As illustrated in FIG. 7, the nonvolatile memory element 1G of the seventh embodiment has a plurality of first wires 7 (Cu/TaN) arranged in a stripe pattern on the substrate 1 so as to extend in an X direction. A diode material 9 is formed on each of the first wires 7 to have an identical shape by means of patterning. An interlayer dielectric film 3 (SiO$_2$, having a film thickness of 500 nm) is formed so as to cover the first wires 7 and the diode materials 9. A plurality of second wires 8 (Cu/TaN) are arranged in a stripe pattern on the interlayer dielectric film 3 so as to extend in a Y direction that intersects the extending direction X of the first wires 7. The interlayer dielectric film 3 is provided with cylindrical contact holes each located at a position where first and second wires 7, 8 intersect each other. Each contact hole is provided on an inner wall face thereof with a variable resistance film 4 (Fe$_3$O$_4$, having a film thickness of 10 nm). Further, an embedded insulating film 5 (SiO$_2$) is filled within each contact hole which is defined by the variable resistance film 4. Accordingly, in each region where first and second wires 7, 8 intersect each other, the variable resistance film 4 is held between the first wire 7 serving as a first electrode and the second wire 8 serving as a second electrode. The variable resistance film 4 thus sandwiched functions as a storage section. With the configuration described above, a cross point type large-capacity nonvolatile memory element can be attained.

The seventh embodiment differs from the third embodiment in that the diode material 9 is disposed just under the variable resistance film 4 in the seventh embodiment. This configuration has such an advantage that a flow of sneak current into adjacent cells which occurs during read-out and write-in can be prevented, even in the case of a cross-point configuration formed by arranging the nonvolatile memory element 1G of the seventh embodiment in a matrix pattern.

While the diode material 9 common to cells is formed just over each first wire 7 in order to reduce the number of masks and therefore realize cost savings in the seventh embodiment, the diode material 9 may be separately provided for each cell. In addition, although the diode material 9 is provided on the side of each first wire 7 in the seventh embodiment, it may be provided on the side of the second wire 8 or may be provided on both sides.

According to the seventh embodiment, in each intersection region where first and second wires 7, 8 intersect each other, the first wire 7 serves as a first electrode whereas the second wire 8 serves as a second electrode. Therefore, other first and second electrodes than the first and second wires 7, 8 are not provided. However, unless other first and second electrodes are provided, chemical reactions, peeling, degradation of the resistance change characteristic sometimes occur depending on selection of the material of the variable resistance film and the wires. In this case, first and second electrodes may be disposed between the variable resistance film and the first and second wires, respectively.

Eighth Embodiment

Configuration of Nonvolatile Memory Element

Figure 11:
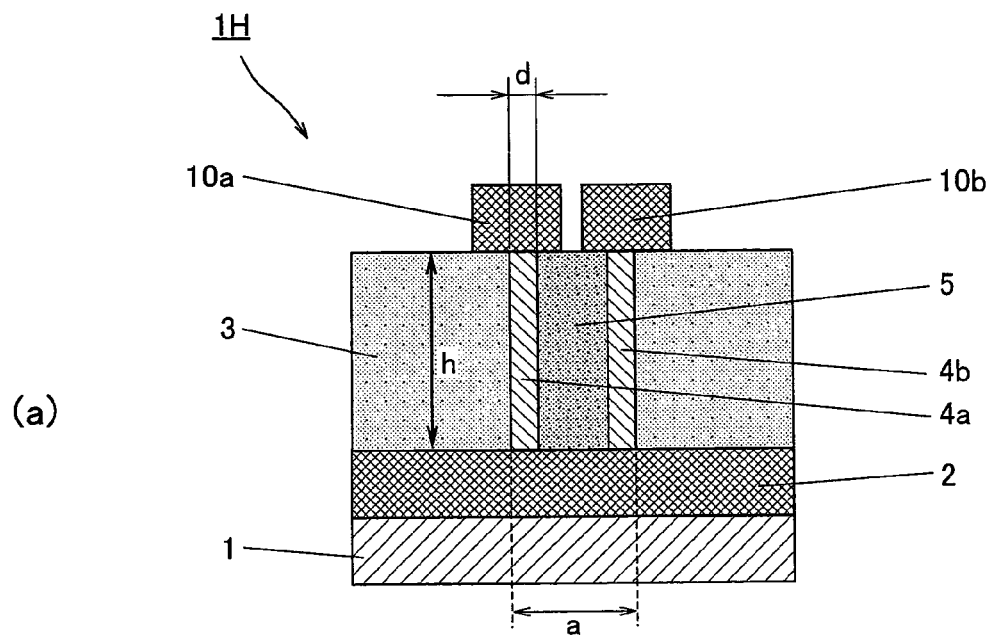
FIG. 11(a) is a sectional view showing the configuration of a nonvolatile memory element according to an eighth embodiment of the invention.
FIG. 11(b) is a plan view thereof.
Figure 11:
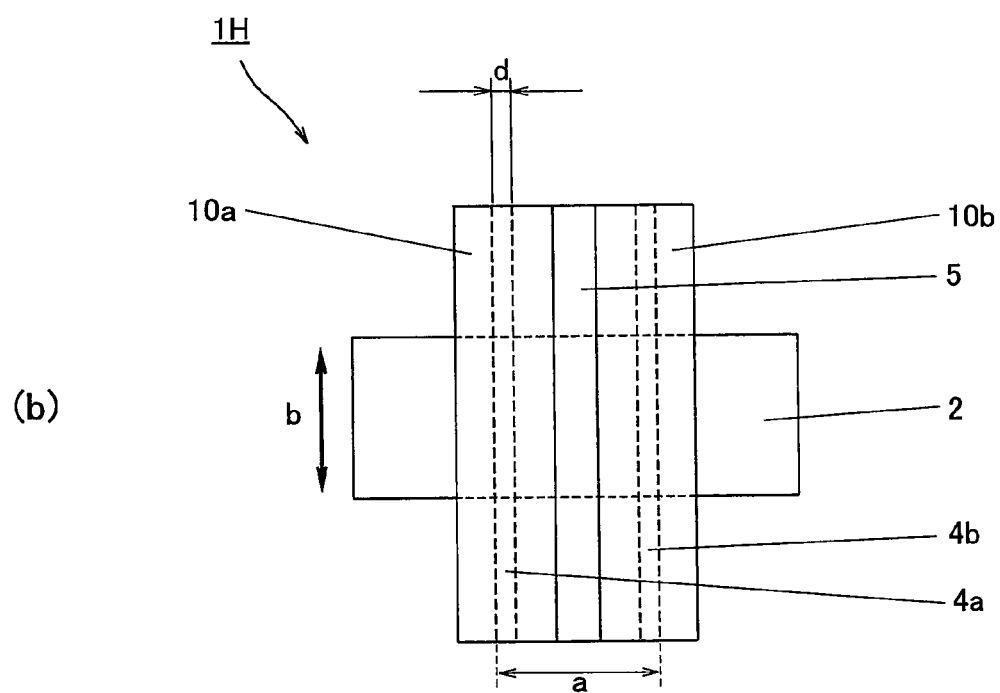

FIG. 11(a) is a sectional view showing the configuration of a nonvolatile memory element according to an eighth embodiment of the invention, and FIG. 11(b) is a plan view thereof. As illustrated in FIGS. 11(a), 11(b), the nonvolatile memory element 1H of the eighth embodiment has a first electrode 2 (Cu/TaN) formed on a substrate 1 and an interlayer dielectric film 3 (SiO$_2$, having a film thickness of 500 nm) formed on the first electrode 2. Openings in the form of a groove are provided so as to pierce through the interlayer dielectric film 3 and so as to intersect the first electrode. Variable resistance films 4a, 4b (Fe$_3$O$_4$, having a film thickness of 10 nm), are formed on inner wall faces of each opening, respectively. An embedded insulating film 5 (SiO$_2$) is filled in the interior region of the opening defined by the variable resistance films 4a, 4b. Further, second electrodes 10a, 10b (Cu/TaN) are formed on the variable resistance films 4a, 4b, respectively, which are formed on the inner wall faces of the opening.

This configuration has not only the above-described effect of achieving higher cell resistance and flexible design but also an additional effect described below. Specifically, two separate variable resistance films 4a, 4b are formed on the inner wall faces, respectively, of the groove-shaped opening within one cell where the first electrode 2 and the groove-shaped opening intersect each other. Therefore, by connecting the second electrodes 10a, 10b to the variable resistance films 4a, 4b respectively, two items of data can be stored in one cell, which realizes a multiple-value memory. As a result, a high-capacity nonvolatile memory element more suited for miniaturization can be realized.

(High-Resistance Cells)

High-resistance cells achieved by the nonvolatile memory element of the eighth embodiment will be hereinafter described in comparison with the prior art.

As shown in FIGS. 11(a), 11(b), the width and height of the groove-shaped opening are designated by a and h respectively. The film thickness of the variable resistance films 4a, 4b and the width of the first electrode 2 are designated by d and b, respectively. Where the resistivity of the variable resistance films is ρ, the cell resistance R0 of the known nonvolatile memory element corresponding to the nonvolatile memory element 1H shown in FIGS. 11(a), 11(b) (this known nonvolatile memory element does not have an embedded insulating film but has variable resistance films the width of which is equal to the width a of the opening) is thought to be equal to the resistance of the variable resistance films formed in the region (area a×b) where the first and second electrodes intersect each other and will therefore be given by the following equation.

$$R0 = \rho \times d / a \times b$$
$$= \rho d / ab$$

On the other hand, the cell resistance R1 of the nonvolatile memory element 1H of the eighth embodiment shown in FIGS. 11(a), 11(b) will be given by the following equation.

$$R1 = \rho \times h / b \times d$$
$$= \rho h / bd$$

Therefore, the rate of increase of resistance ΔR is calculated as follows.

$$\Delta R = R1 / R0$$
$$= ah / d^2$$

This is four times the rate of increase of resistance of the first embodiment of the invention.

If the target is the rate of increase of resistance ΔR (that is no less than 10 times the cell resistance of the prior art) that has been deemed, in the prior art, to be difficult to achieve depending on the increased film thickness of the variable resistance films and the decreased area of the electrodes, $$ah \geq 10d^2$$

is derived from the above equation. That is, it is desirable to meet the relationship in which the product of the diameter of the opening hole and the height of the opening is no less than 10 times the square of the film thickness of the variable resistance films.

(Manufacturing Method of Nonvolatile Memory Element)

Figure 25A:
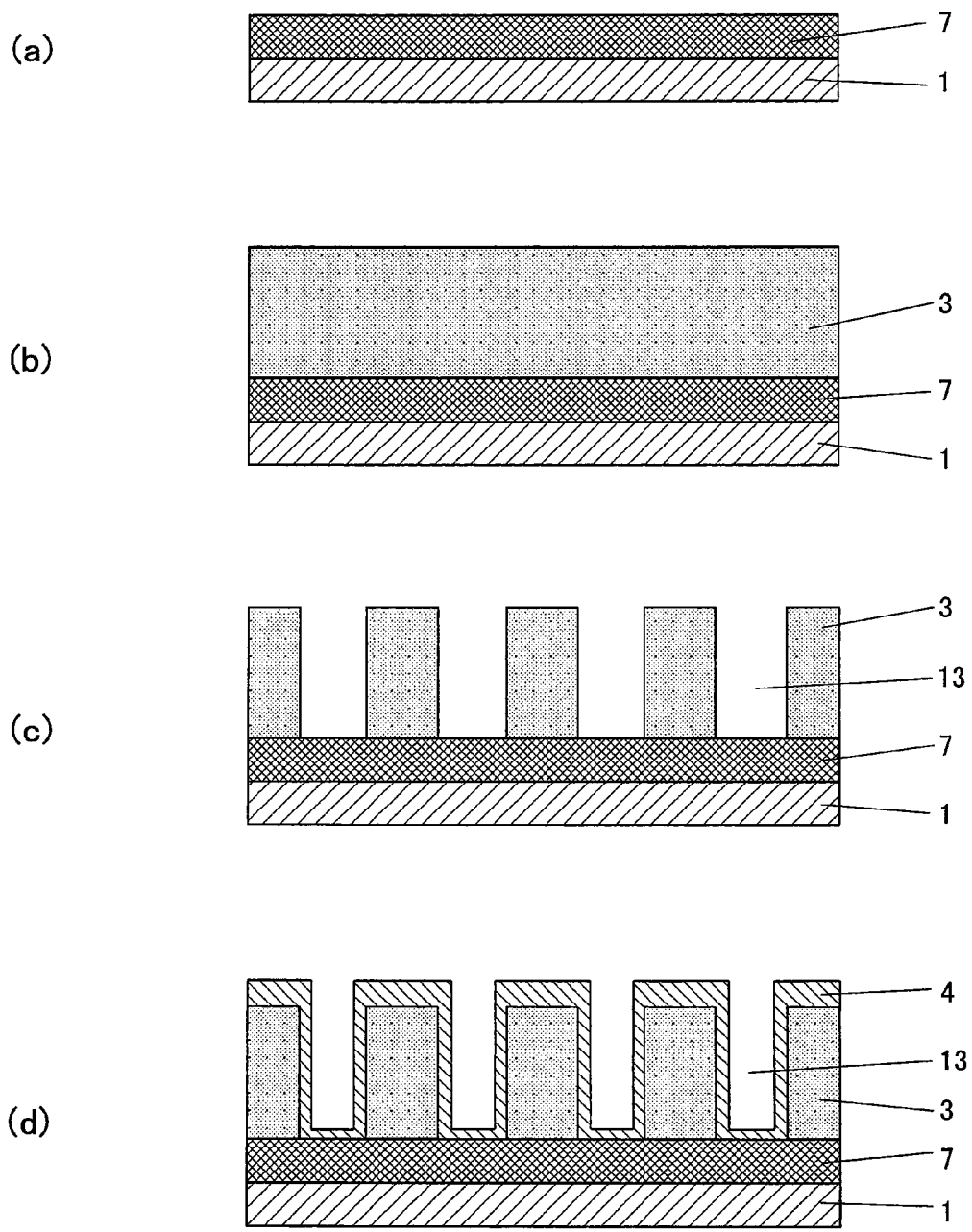
FIG. 25A is diagrams each showing a step in a manufacturing method of the nonvolatile memory element according to the eighth embodiment of the invention, wherein FIG. 25A(a) is a sectional view showing the step of forming a first wire.

Next, a manufacturing method for the nonvolatile memory element of the eighth embodiment of the above configuration will be explained. FIGS. 25A(a) to 25A(d) and FIGS. 25B(a) to 25B(d) are sectional views each showing a step in the manufacturing method of the nonvolatile memory element according to the eighth embodiment of the invention. The steps shown in FIGS. 25A(a) to 25(b) are the same as the steps (shown in FIGS. 14(a) to 14(b)) of the manufacturing method of the nonvolatile memory element according to the first embodiment described earlier and therefore an explanation thereof will be omitted.

In the step shown in FIG. 25A(c), 250 nm-wide, groove-shaped openings 13 are formed by a dry etching process so as to pierce through the interlayer dielectric film 3, so that the first wires 7 are exposed. These groove-shaped openings 13 are so formed as to intersect the first wires 7.

In the step shown in FIG. 25A(d), a variable resistance film 4 made of a transition metal oxide film material such as $FeO_x$ is formed on the exposed faces of the interlayer dielectric film 3 and the first wires 7 by sputtering.

Figure 25B:
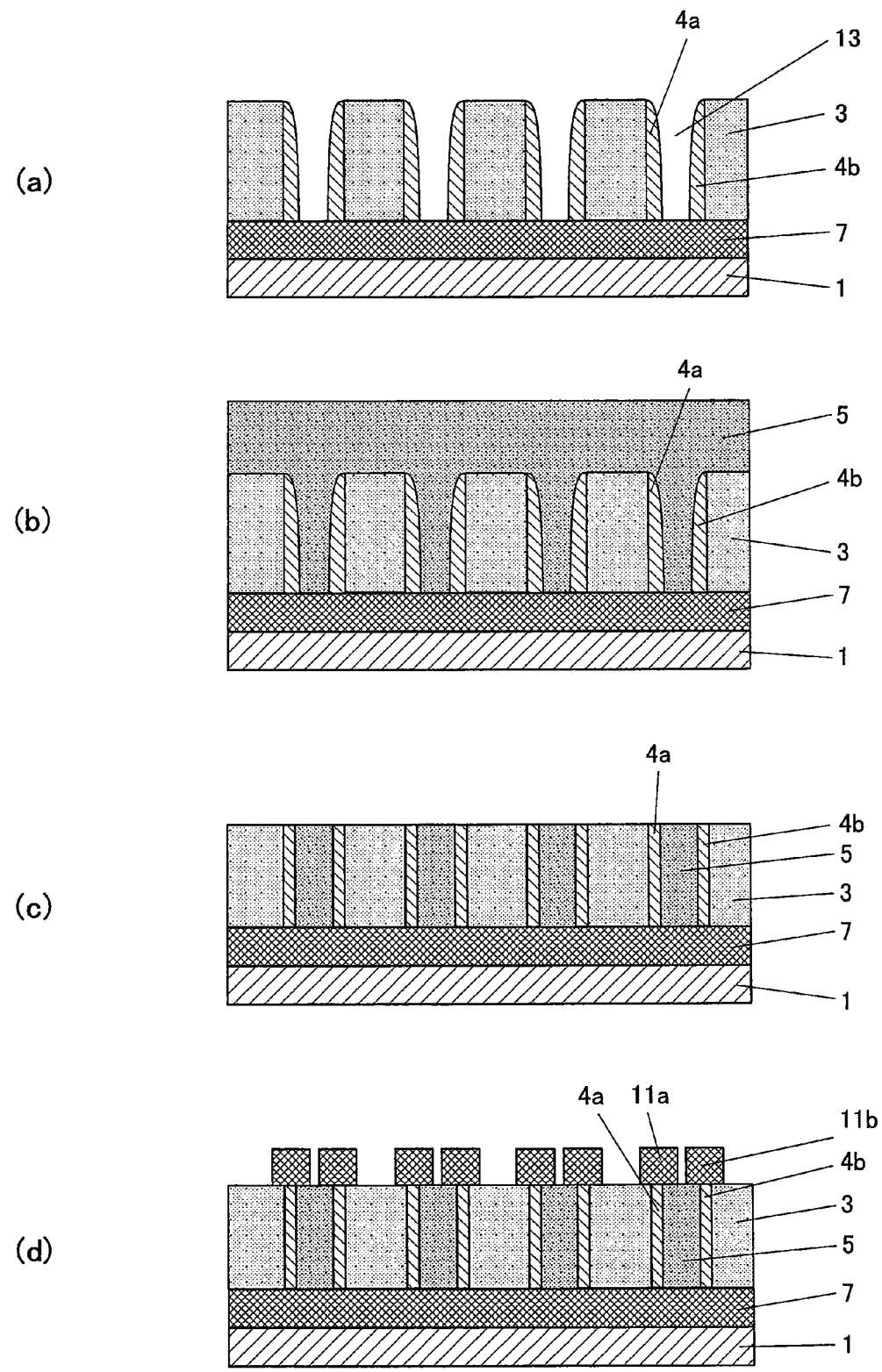
FIG. 25B is diagrams each showing a step in the manufacturing method of the nonvolatile memory element according to the eighth embodiment of the invention, wherein FIG. 25B(a) is a sectional view showing the step of removing the variable resistance film on the upper face of the interlayer dielectric film.
Figure 26:
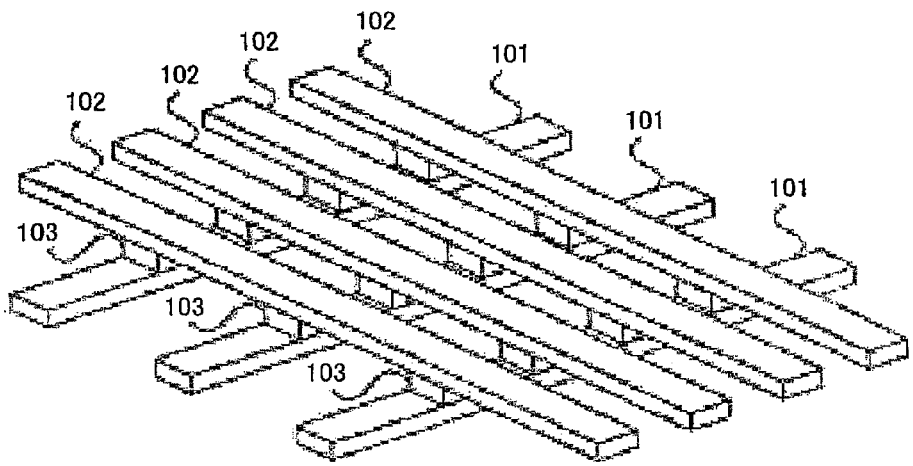
FIG. 26 is a sectional perspective view showing a major part of a first known cross-point type nonvolatile memory element.
Figure 27:
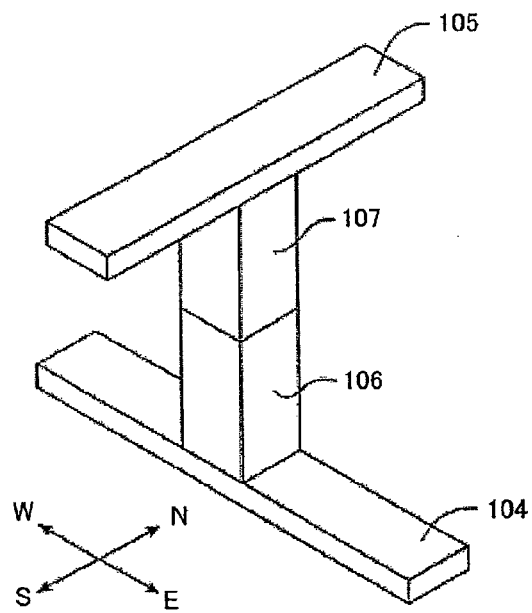
FIG. 27 is a sectional perspective view showing a major part of a second known nonvolatile resistance memory element.

In the step shown in FIG. 25B(a), all the faces of the interlayer dielectric film 3 are etched back to thereby remove the variable resistance film formed on the top of the interlayer dielectric film 3. At that time, the variable resistance film at the bottom faces of the groove-shaped openings 13 is removed by etch back, whereas, on the inner wall faces of the groove-shaped openings, the variable resistance films 4a, 4b are formed in a self-alignment manner so as to have the shape of side walls.

Next in the step shown in FIG. 25B(b), the embedded insulating film 5 consisting of an F (fluorine)-doped oxide film is deposited by CVD so as to have a thickness of 400 nm. Since the width of the groove-shaped openings is 250 nm, the contact holes 12 are filled with the embedded insulating film 5 by depositing the 400 nm-thick embedded insulating film 5 in this way.

In this case, the embedded insulating film 5 grows from the inner wall faces of the groove-shaped openings so that the interior region of each groove-shaped opening is filled with the embedded insulating film 5. In this process flow, the groove-shaped openings are formed so as to correspond to each of the plurality of first wires 7 and therefore the embedding is facilitated compared to the case where contact holes are formed.

Then, in the step shown in FIG. 25B(c), the embedded insulating film 5 is polished by CMP so as to leave the embedded insulating film 5 in the groove-shaped openings only. In this case, it is preferable to polish the underlaid interlayer dielectric film by approximately 50 nm by CMP. The purpose of this is to expose the variable resistance films 4a, 4b without fail. In addition, the upper parts of the side-wall-shaped variable resistance films 4a, 4b are polished, thereby reducing the difference (variations) in the film thickness of the variable resistance films 4a, 4b between the upper part and lower part of each opening.

Finally, as shown in FIG. 25B(d), second wires 11a and 11b, each composed of a close contact layer TaN and a main portion Cu material (Cu/TaN=180 nm/20 nm) which are stacked in this order, are formed so as to extend in a specified direction. The second wires 11a and 11b have a width of 300 nm and thickness of 200 nm. These second wires 11a, 11b are formed so as to close the top faces of the variable resistance films formed on both inner wall side faces of each groove-shaped opening.

Ninth Embodiment

Configuration of Nonvolatile Memory Element

Figure 12:
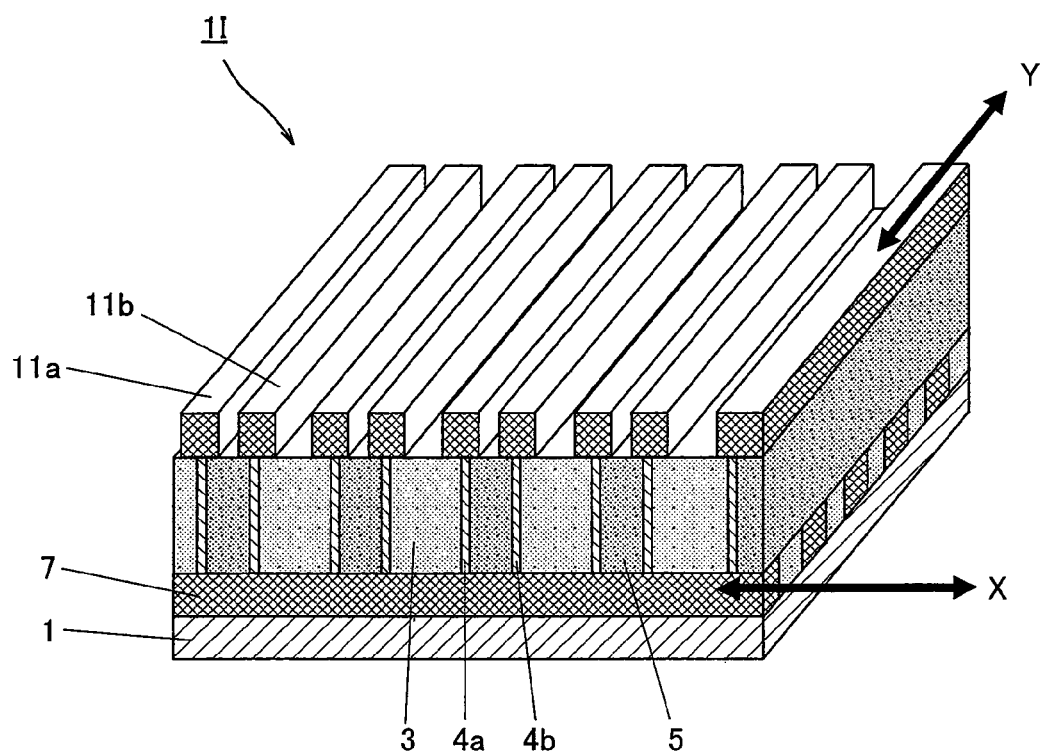
FIG. 12 is a sectional perspective view showing the configuration of a nonvolatile memory element according to a ninth embodiment of the invention.
Figure 13:
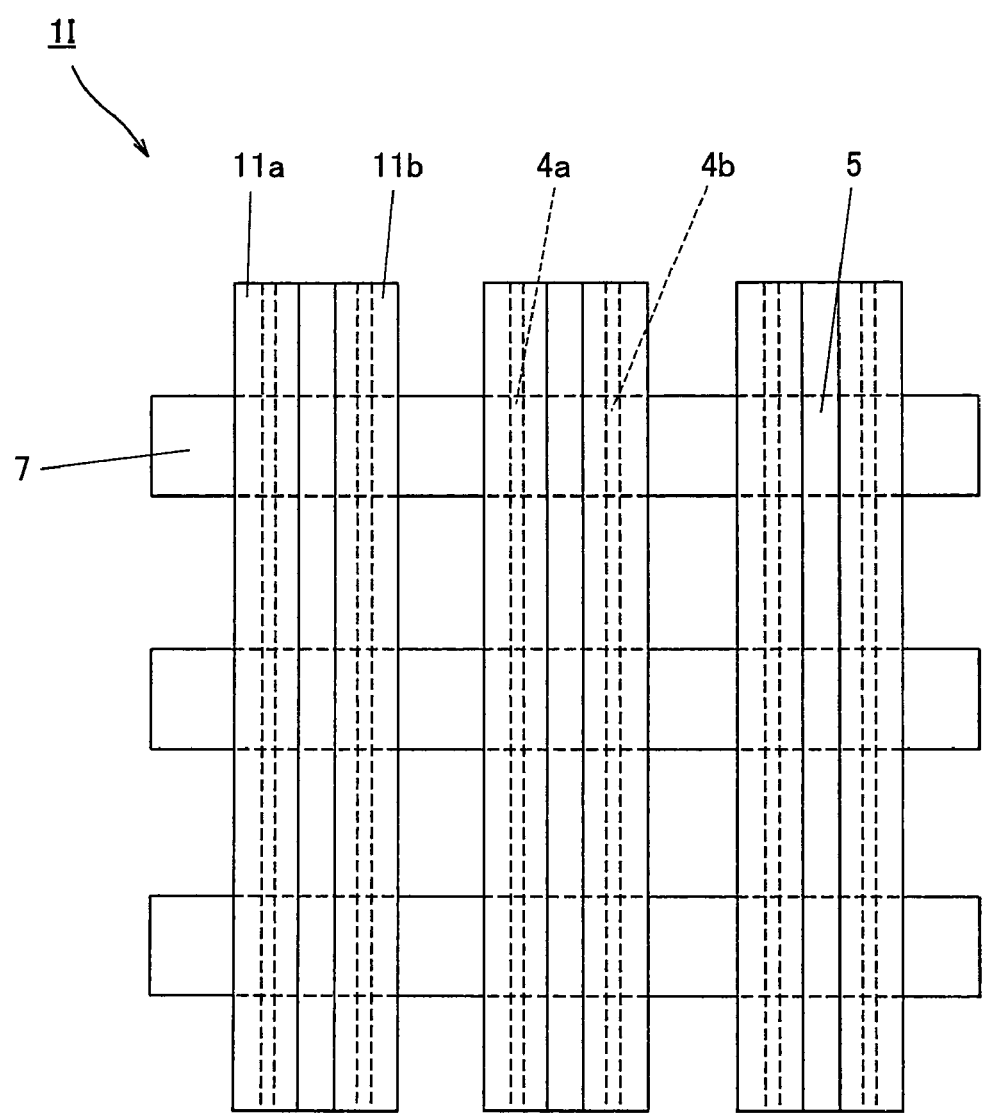
FIG. 13 is a plan view showing the configuration of the nonvolatile memory element according to the ninth embodiment of the invention.

FIGS. 12, 13 are a sectional perspective view and a plan view, respectively, which show the configuration of a nonvolatile memory element according to a ninth embodiment of the invention.

As illustrated in FIG. 12, the nonvolatile memory element 1I of the ninth embodiment has a plurality of first wires 7 (Cu/TaN) arranged in a stripe pattern on the substrate 1 so as to extend in an X direction. An interlayer dielectric film 3 (SiO$_2$, having a film thickness of 500 nm) is formed on the first wires 7. A plurality of second wires 11a, 11b (Cu/TaN) are arranged in a stripe pattern on the interlayer dielectric film 3 so as to extend in a Y direction that intersects the extending direction X of the first wires 7. The interlayer dielectric film 3 is provided with groove-shaped openings each of which intersects the first wires 7 and runs in parallel with the second wires 11a, 11b. Each groove-shaped opening is provided on inner side wall faces at both sides with variable resistance films 4a, 4b (Fe$_3$O$_4$, having a film thickness of 10 nm), respectively. Further, an embedded insulating film 5 (SiO$_2$) is embedded in the interior region of each groove-shaped opening which is defined by the variable resistance films 4a, 4b.

Therefore, in each region where a first wire 7 and a second wire 8 intersect each other, the variable resistance films 4a, 4b are sandwiched between the first wire 7 serving as a first electrode and the second wire 8 serving as a second electrode. The variable resistance films 4a, 4b thus sandwiched functions as a storage section.

As illustrated in FIG. 13, two variable resistance films 4a, 4b are separately formed within one cell that is a region where a first wire 7 and a groove-shaped opening intersect each other. Since the second wires 11a, 11b are connected to the variable resistance films 4a, 4b respectively, two items of data can be stored in one cell, which realizes a multiple-value memory. As a result, a high-capacity nonvolatile memory element more suited for miniaturization can be attained.

According to the ninth embodiment, in each intersection region where a first wire 7 and a second wire 8 intersect each other, the first wire 7 constitutes a first electrode whereas the second wire 8 constitutes a second electrode. Therefore, other first and second electrodes than the first and second wires 7, 8 are not provided. However, unless other first and second electrodes are provided, chemical reactions, peeling, degradation of the resistance change characteristic sometimes occur depending on the selection of the material of the variable resistance films and the wires. In this case, first and second electrodes may be disposed between the variable resistance films and the first and second wires, respectively.

Although the variable resistance films 4a, 4b are physically separately provided on the inner wall faces of each groove-shaped opening, another variable resistance film may be provided on the bottom face of the groove-shaped opening so as to be physically connected to these variable resistance films 4a, 4b, provided that the variable resistance films are made of a material that does not cause cross-talk (such as materials having high bulk resistance).

Although FeO$_x$ is used as the material of the variable resistance film in each of the foregoing embodiments, other transition metals such as Ni, Ti, Hf and Zr may be used.

Although Cu (closely contact layer TaN) is used as a wiring material in each of the foregoing embodiments, Al, Pr, W or the like, which is used in the process of manufacturing Si semiconductor, may be used.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The nonvolatile memory element and nonvolatile memory apparatus according to the invention enable it to achieve high speed operation and high integration and therefore are useful as a nonvolatile memory element or the like for use in electronic hardware such as portable information devices and home information appliances.

The manufacturing method of a nonvolatile memory element or nonvolatile memory apparatus according to the invention enables it to achieve high speed operation and high integration and therefore is useful as a method for fabricating a nonvolatile memory element or the like for use in electronic hardware such as portable information devices and home information appliances.

The invention claimed is:

1. A nonvolatile memory element comprising:
a first electrode;
a second electrode formed above the first electrode;
a variable resistance film formed between the first electrode and the second electrode, a resistance value of the variable resistance film being increased or decreased by an electric pulse applied between the first and second electrodes; and
an interlayer dielectric film provided between the first and second electrodes, wherein:
said interlayer dielectric film is provided with an opening extending from a surface thereof to the first electrode and having height which is not less than a thickness of the variable resistance film;
said variable resistance film is formed at an inner wall face of said opening;
an interior region of said opening which is defined by the variable resistance film is filled with an embedded insulating film,
said nonvolatile memory element is configured not to flow a current in a portion other than the variable resistance film, when the electric pulse is applied between said first electrode and said second electrode,
said opening is groove-shaped,
said variable resistance film is formed at both inner wall faces of said groove-shaped opening thereby forming a first variable resistance film and a second variable resistance film, and
said second electrode includes two second electrodes provided to contact to said first and second variable resistance films formed at said inner wall faces, respectively.

2. A nonvolatile memory device comprising:
a substrate;
a plurality of first wires formed on the substrate so as to extend in parallel with one another;
a plurality of second wires formed within a plane which is located above the plurality of first wires and is parallel to a main surface of said substrate, the plurality of second wires extending in parallel with one another and spatially intersecting the plurality of first wires; and
a plurality of memory cells arranged in a matrix pattern so as to correspond to spatial intersection points, respectively, where the first and second wires spatially intersect, wherein:
each of the plurality of memory cells includes:
a first electrode that constitutes or is connected to the first wires;
a second electrode that is formed above the first electrode and that constitutes or is connected to the second wires;

a variable resistance film formed between the first electrode and the second electrode, a resistance value of the variable resistance film being increased or decreased by an electric pulse applied between the first and second electrodes; and an interlayer dielectric film provided between the first and second electrodes, said interlayer dielectric film is provided with an opening extending from a surface thereof to the first electrode and having a height which is not less than a thickness of the variable resistance film, said variable resistance film is formed at an inner wall face of said opening, an interior region of said opening which is defined by said variable resistance film is filled with an embedded insulating film, said nonvolatile memory device is configured not to flow a current in a portion other than the variable resistance film, when the electric pulse is applied between said first electrode and said second electrode, and in each of the plurality of memory cells, said opening is groove-shaped, said variable resistance film is formed at both inner wall faces of said groove-shaped opening thereby forming a first variable resistance film and a second variable resistance film, and said second electrode includes two second electrodes provided to contact to said first and second variable resistance films formed at said inner wall faces, respectively.

* * * * *